(12) United States Patent
Wang et al.

(10) Patent No.: US 9,997,224 B2
(45) Date of Patent: Jun. 12, 2018

(54) MEMORY ARCHITECTURE WITH MULTI-BANK MEMORY CELL ARRAY ACCESSED BY LOCAL DRIVE CIRCUIT WITHIN MEMORY BANK

(71) Applicant: Piecemakers Technology, Inc., Hsinchu (TW)

(72) Inventors: Ming-Hung Wang, Hsinchu (TW); Gyh-Bin Wang, Hsinchu County (TW); Tah-Kang Joseph Ting, Taipei (TW)

(73) Assignee: Piecemakers Technology, Inc., Hsinchu (TW)

( * ) Notice: Subject to any disclaimer, the term of this patent is extended or adjusted under 35 U.S.C. 154(b) by 0 days. days.

(21) Appl. No.: 15/414,598

(22) Filed: Jan. 24, 2017

(65) Prior Publication Data

US 2018/0068700 A1 Mar. 8, 2018

Related U.S. Application Data

(60) Provisional application No. 62/384,164, filed on Sep. 6, 2016.

(51) Int. Cl.
*G11C 7/22* (2006.01)
*G11C 8/12* (2006.01)
*G11C 7/06* (2006.01)
*G11C 8/10* (2006.01)
*G11C 7/12* (2006.01)

(52) U.S. Cl.
CPC ............... *G11C 8/12* (2013.01); *G11C 7/065* (2013.01); *G11C 7/12* (2013.01); *G11C 8/10* (2013.01)

(58) Field of Classification Search
CPC .. G11C 8/08; G11C 5/145; G11C 7/12; G11C 11/4085; G11C 11/401; G11C 2029/2602; G11C 29/26
USPC .................................................. 365/189.011
See application file for complete search history.

(56) References Cited

U.S. PATENT DOCUMENTS

| | | | | |
|---|---|---|---|---|
| 6,125,076 A | * | 9/2000 | Ishikawa | G11C 8/08 365/230.03 |
| 6,301,164 B1 | * | 10/2001 | Manning | G11C 29/785 365/200 |
| 2004/0184327 A1 | * | 9/2004 | Okuda | G11C 29/42 365/199 |
| 2005/0141323 A1 | | 6/2005 | Shim | |
| 2007/0030743 A1 | | 2/2007 | Kim | |
| 2008/0253218 A1 | | 10/2008 | Park | |

(Continued)

*Primary Examiner* — Huan Hoang
*Assistant Examiner* — Minh Dinh
(74) *Attorney, Agent, or Firm* — Winston Hsu

(57) ABSTRACT

A memory architecture includes K first control lines, M groups of second control lines and a memory cell array. K and M are positive integers. Each group of second control lines includes at least one second control line. The memory cell array includes M memory banks. Each memory bank is coupled to the K first control lines. The M memory banks are selected according to M bank select signals respectively so as to receive a shared set of first control signals through the K first control lines. The M memory banks are coupled to the M groups of second control lines respectively, and receive independent M sets of second control signals through the M groups of second control lines respectively. Each memory bank performs one of a column select operation and a sense amplification operation according to the set of first control signals and a set of second control signals.

18 Claims, 13 Drawing Sheets

(56) References Cited

U.S. PATENT DOCUMENTS

2013/0229848 A1* 9/2013 Vogelsang ............. G11C 5/025
                                                365/63
2015/0006828 A1* 1/2015 Reches ................. H04L 47/36
                                                711/153

* cited by examiner

MEMORY ARCHITECTURE WITH MULTI-BANK MEMORY CELL ARRAY ACCESSED BY LOCAL DRIVE CIRCUIT WITHIN MEMORY BANK

CROSS REFERENCE TO RELATED APPLICATIONS

This application claims the benefit of U.S. provisional application No. 62/384,164, filed on Sep. 6, 2016, the contents of which are incorporated herein by reference.

BACKGROUND OF THE INVENTION

1. Field of the Invention

The disclosed embodiments of the present invention relate to memory, and more particularly, to a memory architecture including a memory cell array divided into multiple memory banks which can be accessed independently of each other according to a shared address decoder.

2. Description of the Prior Art

A conventional memory bank has its own independent/dedicated column select decoders (or bit switches) and bit line sense amplifier control signals to perform data access. However, in a case where a conventional memory device having multiple memory banks is utilized to perform data access, as different memory banks need respective column select decoders and respective bit line sense amplifier control signals, areas and costs of memory dies increase greatly.

SUMMARY OF THE INVENTION

It is therefore one objective of the present invention to provide a circuit architecture and a latch-type local drive circuit so that memories can share a global address decoder circuit, thus greatly reducing influence of memory die areas to realize an architecture having multiple independent sets of memory banks.

According to an embodiment of the present invention, an exemplary memory architecture is disclosed. The exemplary memory architecture comprises K first control lines, M groups of second control lines and a memory cell array. K and M are positive integers. Each of the M groups of second control lines comprises at least one second control line. The memory cell array comprises M memory banks. Each of the M memory banks comprises a plurality of memory cells arranged in rows and columns. Each of the M memory banks is coupled to the K first control lines, while the M memory banks are coupled to the M groups of second control lines respectively. The M memory banks are selected according to M bank select signals respectively so as to receive a shared set of first control signals through the K first control lines. The M memory banks receive independent M sets of second control signals through the M groups of second control lines respectively. Each of the M memory banks drives the columns according to a corresponding bank select signal, the set of first control signals and a corresponding set of second control signals so as to perform one of a column select operation and a sense amplification operation.

The proposed memory architecture may provide a plurality of memory banks in one memory cell array, wherein the memory banks can be accessed independently of each other according to a shared address decoder circuit (e.g. including a global column select decoder and/or a global memory section decoder) by employing a latch-type local drive circuit (e.g. including a column select drive circuit and/or a sense amplifier drive circuit), thereby achieving high bandwidth data access and high speed random access.

These and other objectives of the present invention will no doubt become obvious to those of ordinary skill in the art after reading the following detailed description of the preferred embodiment that is illustrated in the various figures and drawings.

DETAILED DESCRIPTION

To provide flexible data access mechanism, the proposed memory architecture may employ a hierarchical column driving structure to access a plurality of memory banks included within a memory cell array, wherein the memory banks may be accessed independently in an interleaved sequence according to a shared global signal, respective memory bank select signals and respective local signals, and each memory bank select signal may enable the shared global signal to be applied to a corresponding memory bank. Further description is provided below.

Figure 1:
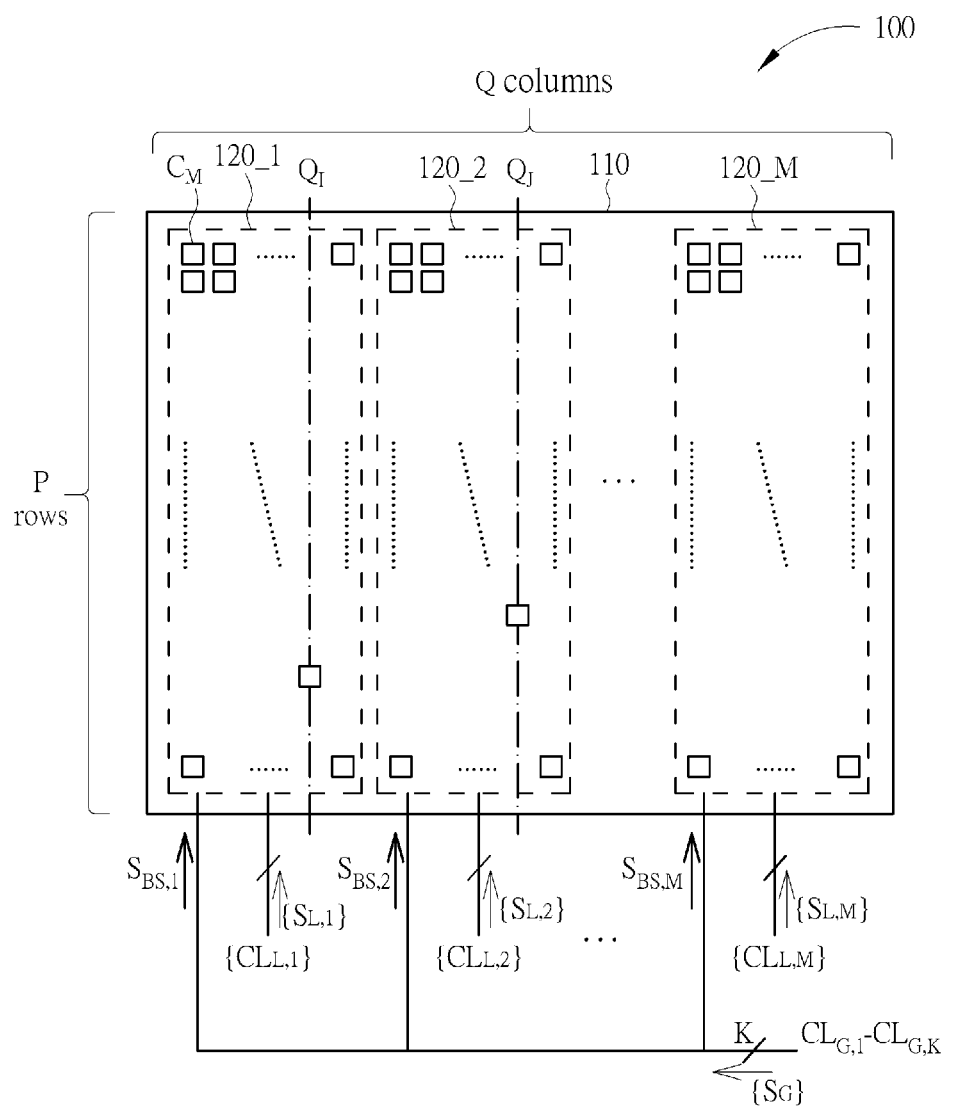
FIG. 1 is a diagram illustrating an exemplary memory architecture according to an embodiment of the present invention.

Please refer to FIG. 1, which is a diagram illustrating an exemplary memory architecture according to an embodiment of the present invention. The memory architecture 100 may include, but is not limited to, a memory cell array 110 which includes a plurality of memory cells arranged in P rows and Q columns (P and Q are positive integers), wherein each memory cell is labeled $C_M$. Each memory cell may be disposed in correspondence with an intersection of a row and a column. By way of example but not limitation, each memory cell may be a one-transistor one-capacitor (1T1C) memory cell. The memory cell array 110 may further include M memory banks 120_1-120_M (M is a positive integer), wherein each of the memory banks 120_1-120_M includes a plurality of memory cells arranged in rows and columns. In other words, the memory cell array 110 may be divided into the memory banks 120_1-120_M, wherein each memory bank may include a portion of the memory cells included in the memory cell array 110.

Please note that the M memory banks 120_1-120_M may operate independently of each other. Specifically, the M memory banks 120_1-120_M may be accessed independently in an interleaved sequence according to respective address information. For example, the memory architecture 100 may further include K first control lines $CL_{G,1}$-$CL_{G,K}$ (K is a positive integer) and M groups of second control lines $\{CL_{L,1}\}$-$\{CL_{L,M}\}$, wherein each of the M groups of second control lines $\{CL_{L,1}\}$-$\{CL_{L,M}\}$ includes at least one second control line (i.e. one or more second control lines). Each of the M memory banks 120_1-120_M is coupled to the K first control lines $CL_{G,1}$-$CL_{G,K}$, while the M memory banks 120_1-120_M are coupled to the M groups of second control lines $\{CL_{L,1}\}$-$\{CL_{L,M}\}$ respectively. Additionally, the M memory banks 120_1-120_M may receive M bank select signals $S_{BS,1}$-$S_{BS,M}$ respectively, and may be selected/activated according to the bank select signals $S_{BS,1}$-$S_{BS,M}$ respectively so as to receive a shared set of first control signals $\{S_G\}$ (shared global address information) through the K first control lines $CL_{G,1}$-$CL_{G,K}$.

For example, when the memory bank 120_1 is selected according to the received bank select signal $S_{BS,1}$, the memory bank 120_1 may receive the shared set of first control signals $\{S_G\}$ through the K first control lines $CL_{G,1}$-$CL_{G,K}$. When the memory bank 120_1 is unselected/deactivated according to the received bank select signal $S_{BS,1}$, the shared set of first control signals $\{S_G\}$ may have no effect on the memory bank 120_1. In other words, the memory bank select signal $S_{BS,1}$ may enable the shared set of first control signals $\{S_G\}$ to be applied to the memory bank 120_1.

Further, the memory banks 120_1-120_M may receive independent M sets of second control signals $\{S_{L,1}\}$-$\{S_{L,M}\}$ (respective local address/control information) through the M groups of second control lines $\{CL_{L,1}\}$-$\{CL_{L,M}\}$ respectively, wherein each of M sets of second control signals $\{S_{L,1}\}$-$\{S_{L,M}\}$ may include one or more second control signals. For example, the memory banks 120_1 may receive one or more second control signals of the set of second control signals $\{S_{L,1}\}$ through one or more second control lines of the group of second control lines $\{CL_{L,1}\}$ respectively. Accordingly, each of the M memory banks 120_1-120_M may drive the columns of the memory cell array therewithin according to a corresponding bank select signal (one of the bank select signals $S_{BS,1}$-$S_{BS,M}$), the set of first control signals $\{S_G\}$ and a corresponding set of second control signals (one of the sets of second control signals $\{S_{L,1}\}$-$\{S_{L,M}\}$) so as to perform one of a column select operation and a sense amplification operation.

By way of example but not limitation, a portion or all of the shared set of first control signals $\{S_G\}$ may be a set of first column select signals, and a portion or all of the independent M sets of second control signals $\{S_{L,1}\}$-$\{S_{L,M}\}$ may be M sets of second column select signals. In a case where a peripheral circuit of the memory architecture 100 (not shown in FIG. 1) performs column select operations to select bit line(s) of the memory bank 120_1 (corresponding to a column $Q_I$) and bit line (s) of the memory bank 120_2 (corresponding to a column $Q_J$) in sequence, after the memory bank 120_1 selects/activates the column $Q_I$ according to the bank select signal $S_{BS,1}$, the set of first control signals $\{S_G\}$ (the shared set of first column select signals) and the set of second control signals $\{S_{L,1}\}$ (a corresponding set of second column select signals), the memory bank 120_2 may select/activate the column $Q_J$ according to the bank select signal $S_{BS,2}$, the set of first control signals $\{S_G\}$ (the shared set of first column select signals) and the set of second control signals $\{S_{L,2}\}$ (a corresponding set of second column select signals) without waiting for the completion of data access of the memory bank 120_1.

In another example, each of the M memory banks 120_1-120_M may be divided into N memory sections (not shown in FIG. 1), wherein N is a positive integer. A portion or all of the shared set of first control signals $\{S_G\}$ may be a set of section select signals for memory section selection, and a portion or all of the independent M sets of second control signals $\{S_{L,1}\}$-$\{S_{L,M}\}$ may be M sense enable signals respectively (i.e. a portion or all of each set of second control signals may be implemented by a single sense enable signal). In a case where a peripheral circuit of the memory architecture 100 (not shown in FIG. 1) performs sense amplification operations to sense and amplify a data signal stored in a memory cell within the memory bank 120_1 (corresponding to the column $Q_I$) and another data signal stored in a memory cell within the memory bank 120_2 (corresponding to the column $Q_J$) in sequence, after the memory bank 120_1 drives/activates a sense amplifier corresponding to the column $Q_I$ (not shown in FIG. 1) according to the bank select signal $S_{BS,1}$, the set of first control signals $\{S_G\}$ (the shared set of section select signals) and the set of second control signals $\{S_{L,1}\}$ (a corresponding sense enable signal), the memory bank 120_2 may drive/activate a sense amplifier corresponding to the column $Q_J$ (not shown in FIG. 1) according to the bank select signal $S_{BS,2}$, the set of first control signals $\{S_G\}$ and the set of second control signals $\{S_{L,2}\}$ (a corresponding sense enable signal) without waiting for the completion of data access of the memory bank 120_1.

In other words, the proposed memory architecture may eliminate/decrease waiting time of switching between different columns (or bit lines), thus providing high bandwidth and short time delay data transmission.

Additionally, in this embodiment, the K first control lines $CL_{G,1}$-$CL_{G,K}$ may be used as global control lines, and arranged for transmitting a plurality of first control signals $S_{G,1}$-$S_{G,K}$ included in the set of first control signals $\{S_G\}$. The M groups of second control lines $\{CL_{L,1}\}$-$\{CL_{L,M}\}$ may be used as local control lines, wherein one or more second control lines included in each group of second control lines may be arranged for transmitting one or more second control signals included in the set of second control signals $\{S_{L,i}\}$ (i is a positive integer greater than 1 and smaller than or equal to M), respectively. In other words, the memory architecture 100 may have a hierarchical column driving structure, thus reducing an area occupied by a peripheral circuit of the memory cell array 110.

However, the above is for illustrative purposes only, and is not meant to be a limitation of the present invention. For example, in an alternative design, any two of the M memory bank 120_1-120_M may have no shared control lines, and each memory bank may perform a column selection operation and/or a sense amplification operation according to a corresponding bank select signal and control signals received through individual control lines. In brief, as long as a memory cell can employ a structure having multiple memory banks which can be accessed independently in an interleaved sequence, associated alternatives or modifications fall within the spirit and scope of the present invention.

In order to facilitate an understanding of the proposed memory architecture, an exemplary implementation of a memory architecture employing a shared address decoder is given below. One skilled in the art should understand that this is not meant to be a limitation of the present invention. Please refer to FIG. 2, which is an implementation of the memory architecture 100 shown in FIG. 1. The memory architecture 200 may include a memory cell array 210 and a shared address decoder circuit 240, wherein the memory cell array 110 shown in FIG. 1 may be implemented by the memory cell array 210 which may include a plurality of memory banks 220_1-220_8 (i.e. M=8). The shared address decoder circuit 240 is coupled to the memory banks 220_1-220_8, and may decode an X-bit global address $ADD_G$ (X is a positive integer) to generate a set of first control signals (e.g. the set of first control signals $\{S_G\}$ shown in FIG. 1) to the memory banks 220_1-220_8 through a plurality of first control lines (e.g. the first control lines $CL_{G,1}$-$CL_{G,K}$ shown in FIG. 1). The memory banks 220_1-220_8 may further receive a plurality of second control signals $S_{L,11}$-$S_{L,81}$, wherein the sets of second control signals $\{S_{L,1}\}$-$\{S_{L,8}\}$ shown in FIG. 1 may be implemented by the second control signals $S_{L,11}$-$S_{L,81}$ respectively.

Additionally, each of the memory banks 220_1-220_8 may include a local drive circuit (i.e. one of local drive circuits 230_1-230_8) and a plurality of memory cells arranged in rows and columns (not shown in FIG. 2), wherein the local drive circuit may drive the columns according to a corresponding memory bank select signal (one of the bank select signals $S_{BS,1}$-$S_{BS,8}$), the set of first control signals generated by the shared address decoder circuit 240, and a corresponding second control signal (one of the second control signals $S_{L,11}$-$S_{L,81}$) so as to perform one of a column select operation and a sense amplification operation.

In some embodiments, a portion of each local drive circuit may be disposed on one side of a corresponding memory bank in a column direction, and another portion of said each local drive circuit may be disposed on another side of the corresponding memory bank in the column direction. For example, the local drive circuit 230_1 may include a local drive circuit 230_11 and a local drive circuit 230_12 which are disposed on different sides of the memory bank 220_1. In some other embodiments where each memory bank is divided into N memory sections (N is a positive integer) and further includes a plurality of sense amplifier circuits disposed in correspondence with the N memory sections, each local drive circuit may be disposed adjacent to the sense amplifier circuits. For example, the memory bank 220_1 may be divided into N memory sections $MS_{1,1}$-$MS_{1,N}$, and may further include a plurality of sense amplifier circuits (each being labeled BLSA). There may be a portion of local drive circuit 230_1 in each area labeled Z.

It should be noted that each local drive circuit may be implemented by a latch-type drive circuit. Accordingly, after the local drive circuit 230_1 drives the memory bank 220_1, another local drive circuit (one of the local drive circuits 230_2-230_8) may drive a corresponding memory bank without waiting for the completion of data access operations of the memory bank 220_1. In other words, even though the set of first control signals changes in response to updated global address information provided for another memory bank, the local drive circuit 230_1 may maintain current access operations performed on the memory bank 220_1. Operations of the local drive circuits 230_1-230_8 are described in greater detail below.

In some embodiments, the proposed memory architecture may be used for column selection. Please refer to FIG. 2 and FIG. 3 together. FIG. 3 is a diagram illustrating a control configuration employed in the memory architecture 200 shown in FIG. 2 involved with column selection according to an embodiment of the present invention. In this embodiment, a portion or all of the global address $ADD_G$ shown in FIG. 2 may be implemented by a first column address $CAD_G$ shown in FIG. 3 (i.e. the global address $ADD_G$ may include the first column address $CAD_G$). A portion or all of a local drive circuit shown in FIG. 2 may be implemented by a column select drive circuit shown in FIG. 3 (i.e. the local drive circuit 230_1 may include a column select drive circuit 330_1, the local drive circuit 230_2 may include a column select drive circuit 330_2, and so on). A portion or all of the shared address decoder circuit 240 shown in FIG. 2 may be implemented by a first column decoder circuit 340 shown in FIG. 3 (i.e. the shared address decoder circuit 240 may include the first column decoder circuit 340).

The memory architecture 200 may further include a plurality of first control lines $CL_{G,1}$-$CL_{G,8192}$ and a plurality of second control lines $CL_{L,11}$-$CL_{L,81}$ (as shown in FIG. 3), wherein the K first control lines $CL_{G,1}$-$CL_{G,K}$ shown in FIG. 1 may be implemented by the first control lines $CL_{G,1}$-$CL_{G,8192}$ (i.e. $K=2^{13}$), and a portion or all of each group of second control lines shown in FIG. 1 may be implemented by a single second control line (one of the second control lines $CL_{L,11}$-$CL_{L,81}$).

The first column decoder circuit 340 may be coupled to the memory banks 220_1-220_8 through the first control lines $CL_{G,1}$-$CL_{G,8192}$, and arranged for decoding the first column address $CAD_G$ (13 bits in this implementation) to generate a set of first column select signals $\{GCS\}$, wherein a plurality of first column select signals $GCS_1$-$GCS_{8192}$ included in the set of first column select signals $\{GCS\}$ may be transmitted to each of the column select drive circuits 330_1-330_8 through the first control lines $CL_{G,1}$-$CL_{G,8192}$ according to the bank select signals $S_{BS,1}$-$S_{BS,8}$. The column select drive circuits 330_1-330_8 may further receive a plurality of second column select signals $LCS_{1,1}$-$LCS_{8,1}$ through the second control lines $CL_{L,11}$-$CL_{L,81}$ respectively, wherein the second control signals $S_{L,11}$-$S_{L,81}$ shown in FIG. 2 may be implemented by the second column select signals $LCS_{1,1}$-$LCS_{8,1}$ shown in FIG. 3 respectively.

Additionally, each of the memory banks 220_1-220_8 may further include T third control lines ($T=2^{13}$ in this implementation), which may be disposed in correspondence with the columns of the memory bank respectively. Hence, the column select drive circuit of the memory bank may drive/select the columns through the T third control lines. For example, the column select drive circuit 330_1 of the memory bank 220_1 is coupled to the first control lines $CL_{G,1}$-$CL_{G,8192}$, the second control line $CL_{L,11}$ and a plurality of third control lines $CL_{B1,1}$-$CL_{B1,8192}$. Hence, the column select drive circuit 330_1 may drive/activate the third control lines $CL_{B1,1}$-$CL_{B1,8192}$ according to the bank select signal $S_{BS,1}$, the received set of first column select signals $\{GCS\}$ and the second column select signal $LCS_{1,1}$ in order to perform a column select operation to select at least one bit line within the memory bank 220_1 through the third control lines $CL_{B1,1}$-$CL_{B1,8192}$.

Figure 3:
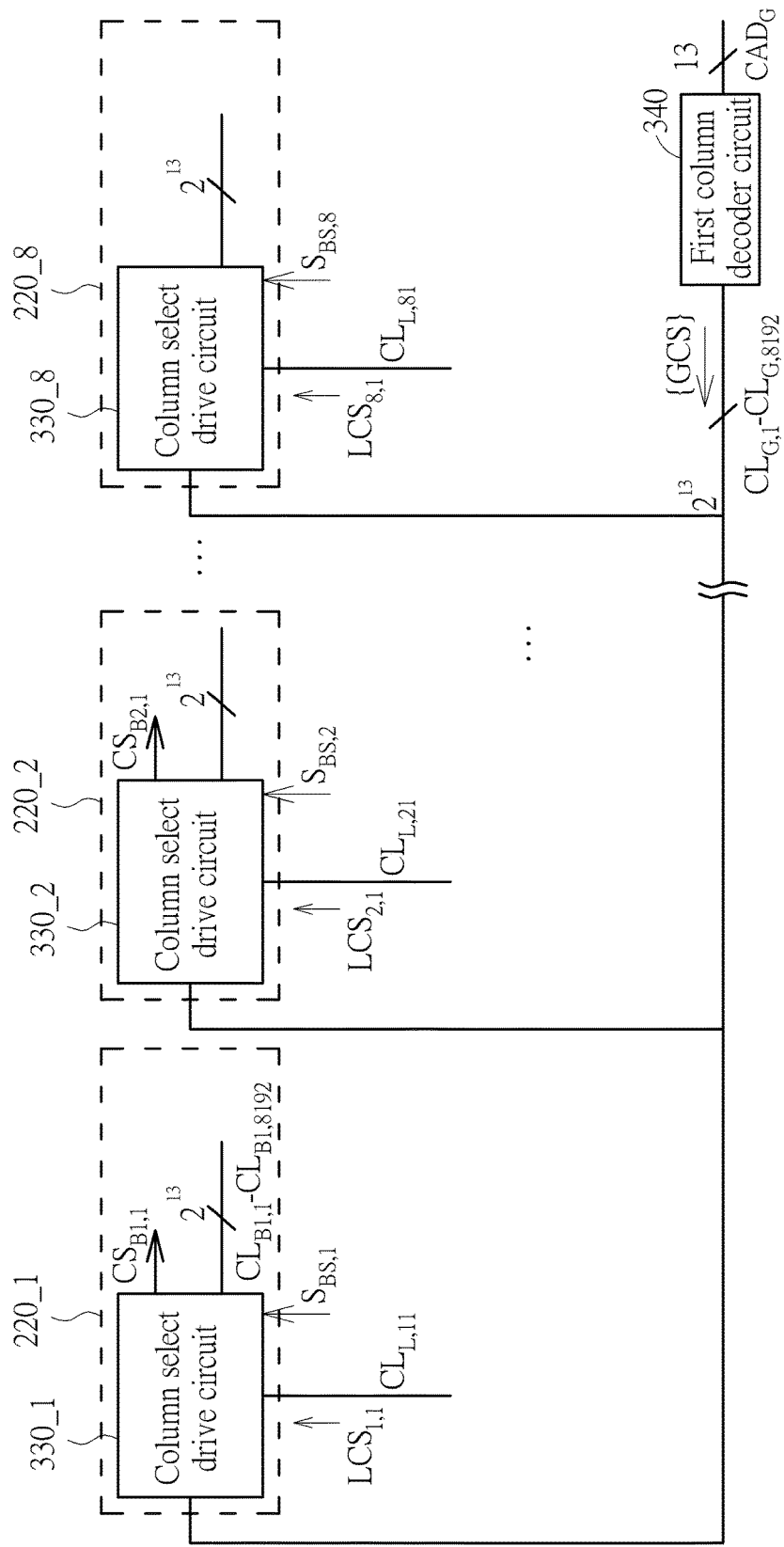
FIG. 3 is a diagram illustrating a control configuration employed in the memory architecture shown in FIG. 2 involved with column selection according to an embodiment of the present invention.
Figure 4:
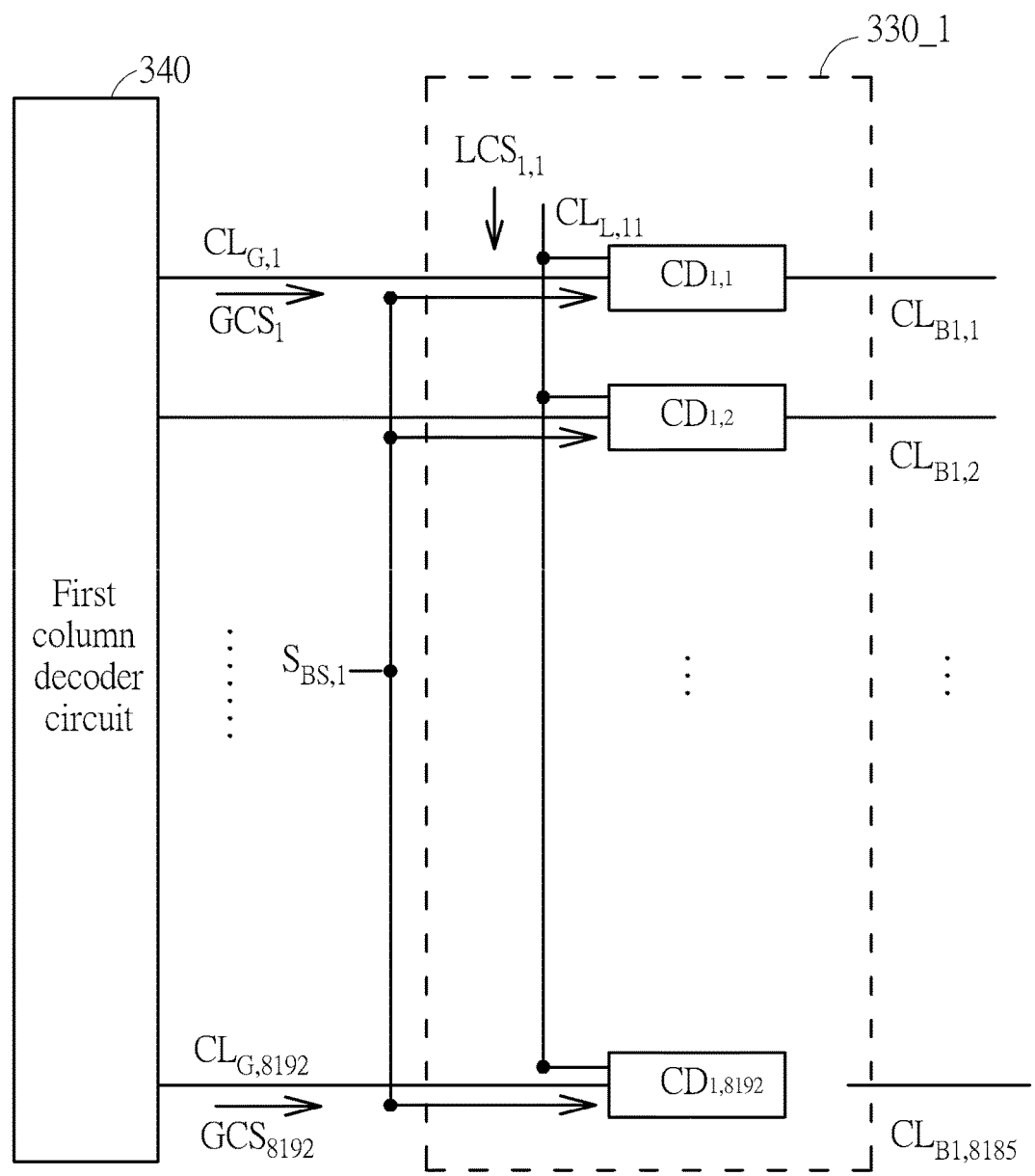
FIG. 4 is an implementation of the column select drive circuit shown in FIG. 3.

Please refer to FIG. 4, which is an implementation of the column select drive circuit 330_1 shown in FIG. 3. The column select drive circuit 330_1 may include a plurality of column select drivers $CD_{1,1}$-$CD_{1,8192}$, which are coupled to the first control lines $CL_{G,1}$-$CL_{G,8192}$ respectively. Each of the column select drivers $CD_{1,1}$-$CD_{1,8192}$ is coupled to the second control line $CL_{L,11}$, and is coupled to a corresponding third control line (one of the third control lines $CL_{B1,1}$-$CL_{B1,8192}$) so as to drive a column. Additionally, the set of first column select signals {GCS} shown in FIG. 3 may include a plurality of first column select signals $GCS_1$-$GCS_{8192}$ respectively transmitted through the first control lines $CL_{G,1}$-$CL_{G,8192}$. Each column select driver may refer to a first column select signal (one of the first column select signals $GCS_1$-$GCS_{8192}$), the second column select signal $LCS_{1,1}$ and the bank select signal $S_{BS,1}$ to perform a column select operation.

In one implementation, each column select driver may be implemented by a latch-type driver. Please refer to FIG. 5, which is a diagram illustrating an implementation of the column select driver $CD_{1,1}$ shown in FIG. 4. In this implementation, the column select driver $CD_{1,1}$ may include an AND gate 562, an OR gate 564 and an AND gate 572. The AND gate 562 has an input terminal $N_{IC1}$, an input terminal $N_{IC2}$ and an output terminal $N_{OC1}$, wherein the input terminal $N_{IC1}$ is coupled to the first control line $CL_{G,1}$, and the input terminal $N_{IC2}$ is coupled to the bank select signal $S_{BS,1}$. The OR gate 564 has an input terminal $N_{IC3}$, an input terminal $N_{IC4}$ and an output terminal $N_{OC2}$, wherein the input terminal $N_{IC3}$ is coupled to the output terminal $N_{OC1}$, the input terminal $N_{IC4}$ is coupled to the third control line $CL_{B1,1}$, and the output terminal $N_{OC2}$ is arranged for outputting a third control signal $S_{CS1,1}$. The AND gate 572 has an input terminal $N_{IC5}$, an input terminal $N_{IC6}$ and an output terminal $N_{OC3}$, wherein the input terminal $N_{IC5}$ is coupled to the third control signal $S_{CS1,1}$, the input terminal $N_{IC6}$ is coupled to the second control line $CL_{L,11}$, and the output terminal $N_{OC3}$ is coupled to the third control line $CL_{B1,1}$.

Figure 5:
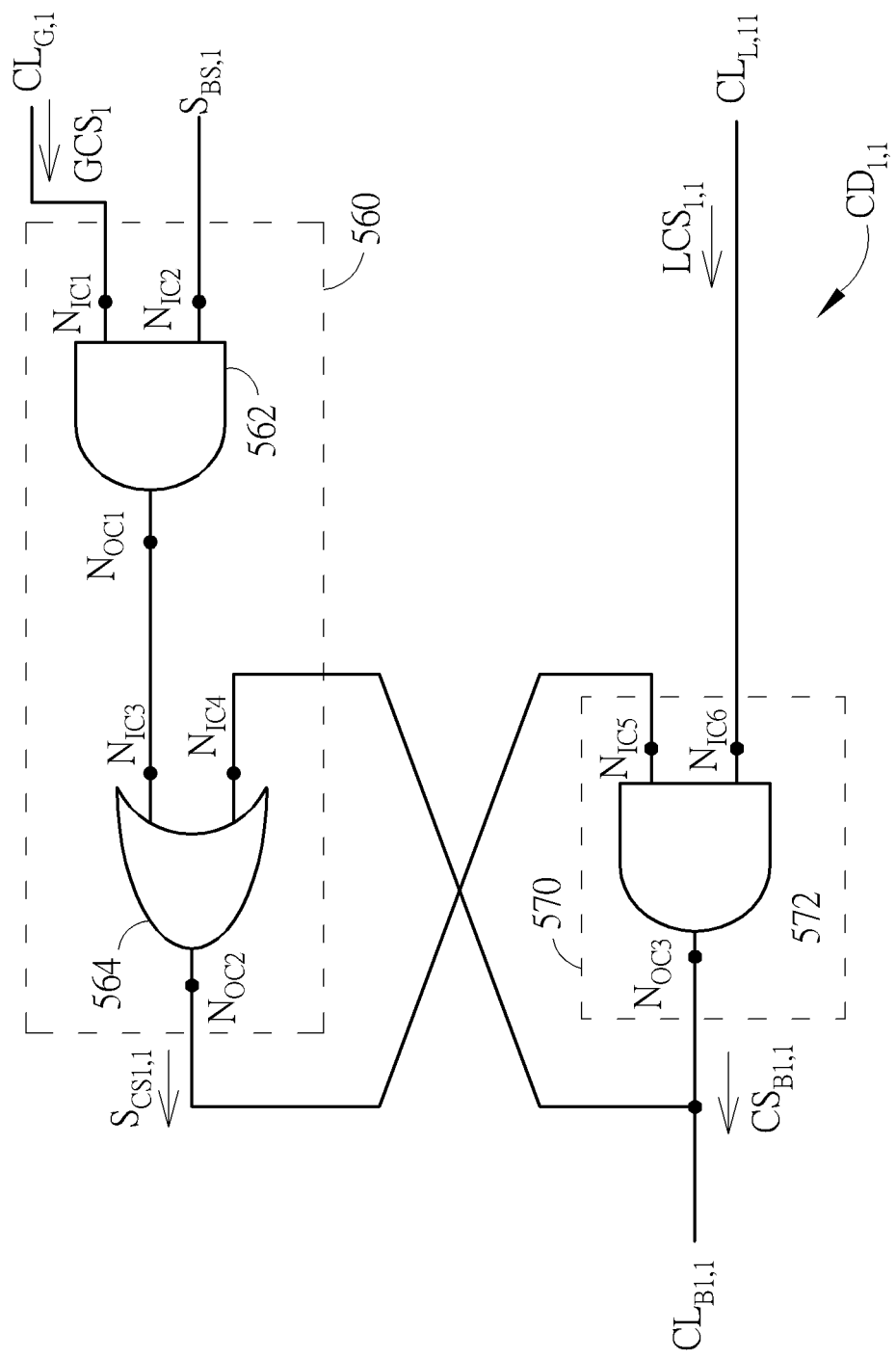
FIG. 5 is a diagram illustrating an implementation of the column select driver shown in FIG. 4.

Please refer to FIGS. 3-5 together. Consider a case where the column select drive circuit 330_1 is utilized to activate the third control line $CL_{B1,1}$ to thereby drive a column (corresponding to at least one bit line). Hence, the memory bank 220_1 is selected according to the memory bank select signal $S_{BS,1}$ (e.g. having a high signal level), the first column select address $CAD_G$ indicates activating the first control line $CL_{G,1}$, and the second control line $CL_{L,11}$ is activated. As the memory bank select signal $S_{BS,1}$ may have a high signal level, the first column select signal $GCS_1$ (e.g. having a high signal level) may be transmitted to the input terminal $N_{IC5}$ through the AND gate 562 and the OR gate 564. In addition, since the second column select signal $LCS_{1,1}$ may have a high signal level due to the activation of the second control line $CL_{L,11}$, the AND gate 572 may generate a drive signal $CS_{B1,1}$ having a high signal level to the third control line $CL_{B1,1}$ so as to activate the column.

It should be noted that, as the drive signal $CS_{B1,1}$ having the high signal level is fed to the input terminal $N_{IC4}$ of the OR gate 564, the third control signal $S_{CS1,1}$ can stay at a high signal level even if the bank select signal $S_{BS,1}$ or the first column select signal $GCS_1$ goes low (e.g. another memory bank or a different column is selected). Hence, the third control line $CL_{B1,1}$ may stay in an activation state rather than vary with a signal level of the first column select signal $GCS_1$. In other words, the column select driver $CD_{1,1}$ may continue activating the third control line $CL_{B1,1}$ without being affected by the changed address information indicated by the first column select address $CAD_G$.

Figure 6:
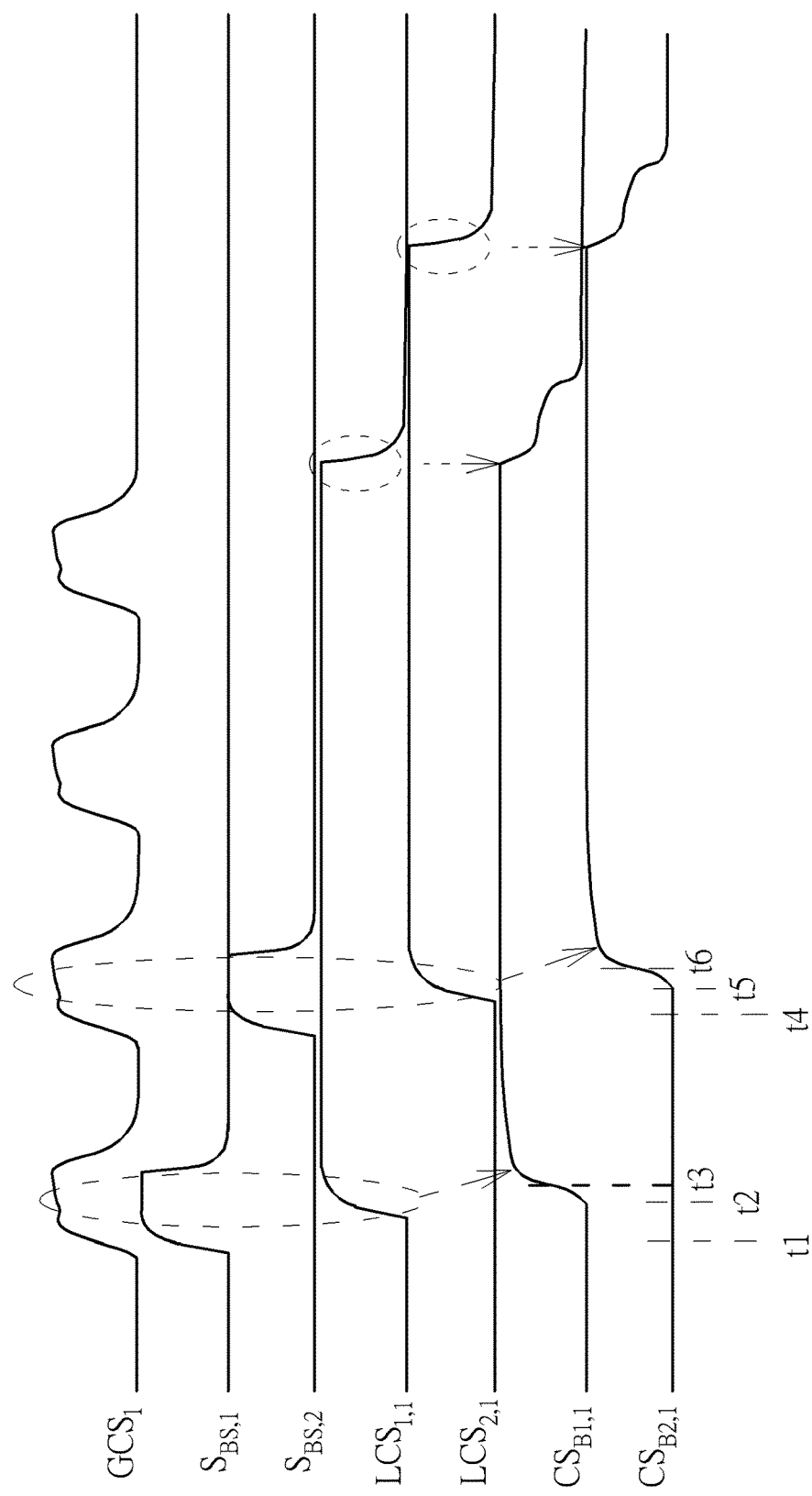
FIG. 6 illustrates a timing diagram of signals of different column select drive circuits shown in FIG. 3 according to an embodiment of the present invention.

With the aid of the column select driver architecture shown in FIG. 5, a plurality of memory banks can operate independently of each other. Please refer to FIG. 6 in conjunction with FIG. 3. FIG. 6 illustrates a timing diagram of signals of different column select drive circuits shown in FIG. 3 according to an embodiment of the present invention. As shown in FIG. 6, at a point in time t1, the memory bank 220_1 is selected according to the bank select signal $S_{BG,1}$, and the first column select signal $GCS_1$ is applied to the memory bank 220_1. Next, the second column select signal $LCS_{1,1}$ is applied to the memory bank 220_1 (a point in time t2), and a column corresponding to the third control line $CL_{B1,1}$ is selected according to the drive signal $CS_{B1,1}$. As can be seen from FIG. 6, the drive signal $CS_{B1,1}$ may stay high for a period of time after the first column select signal $GCS_1$ and the bank select signal $S_{BS,1}$ go low.

As a point in time t4, the memory bank 220_2 is selected according to the bank select signal $S_{BS,2}$, and the first column select signal $GCS_1$ is applied to the memory bank 220_2. Next, a second column select signal $LCS_{2,1}$ is applied to the memory bank 220_2 (a point in time t5), and a column corresponding to a third control line of the memory bank 220_2 is selected according to the drive signal $CS_{B2,1}$. Similarly, the drive signal $CS_{B2,1}$ may stay high for a period of time after the first column select signal $GCS_1$ and the bank select signal $S_{BS,2}$ go low. Additionally, as shown in FIG. 6, the memory bank 220_2 may select/activate a column according to the bank select signal $S_{BS,2}$, the first column select signal $GCS_1$ and the second column select signals $LCS_{2,1}$ without waiting for the completion of column selection of the memory bank 220_1. In other words, the memory banks 220_1 and 220_2 may be accessed independently in an interleaved sequence. As one skilled in the art can readily understand the operation of the column selection operation shown in FIG. 6 after reading the above paragraphs directed to FIGS. 1-5, further description is omitted here for brevity.

Please note that the circuit topology of the column select driver shown in FIG. 5 is for illustrative purposes only, and is not meant to be a limitation of the present invention. For example, the column select driver $CD_{1,1}$ may be regarded to include a control device 560 and a drive device 570, wherein the control device 560 may be implemented by the AND gate 562 and the OR gate 564, and the drive device 570 may be implemented by the AND gate 572. The drive device 570 may generate the drive signal $CS_{B1,1}$ to the third control line $CL_{B1,1}$ according to the third control signal $S_{CS1,1}$ and the second column select signal $LCS_{1,1}$, and the control device 560 may generate the third control signal $S_{CS1,1}$ according to the bank select signal $S_{BS,1}$, the drive signal $CS_{B1,1}$ and the first column select signal $GCS_1$.

Specifically, in a case where the third control line $CL_{B1,1}$ is deactivated in the beginning, when receiving the bank select signal $S_{BS,1}$ having a high signal level and the first column select signal $GCS_1$ having a high signal level, the control device 560 may generate the third control signal $S_{CS1,1}$ having a high signal level to the drive device 570. Next, the drive device 570 may generate the drive signal $CS_{B1,1}$ having a high signal level according to the third control signal $S_{CS1,1}$ and the second column select signal $LCS_{1,1}$, thereby activating the third control line $CL_{B1,1}$. When the third control line $CL_{B1,1}$ is in an activation state (e.g. after the third control line $CL_{B1,1}$ is activated; the drive signal $CS_{B1,1}$ has a high signal level), the control device 560 may generate the third control signal $S_{CS1,1}$ according to the drive signal $CS_{B1,1}$ only (i.e. a signal level of the third control signal $S_{CS1,1}$ may not be affected by the bank select signal $S_{BS,1}$ and the first column select signal $GCS_1$), thereby maintain the activation state of the third control line $CL_{B1,1}$.

In an alternative design, the control device 560 may employ another circuit topology different the circuit topology shown in FIG. 5 based on the aforementioned operations. In another alternative design, the drive device 570 may employ another circuit topology different the circuit topology shown in FIG. 5 based on the aforementioned operations.

Figure 7:
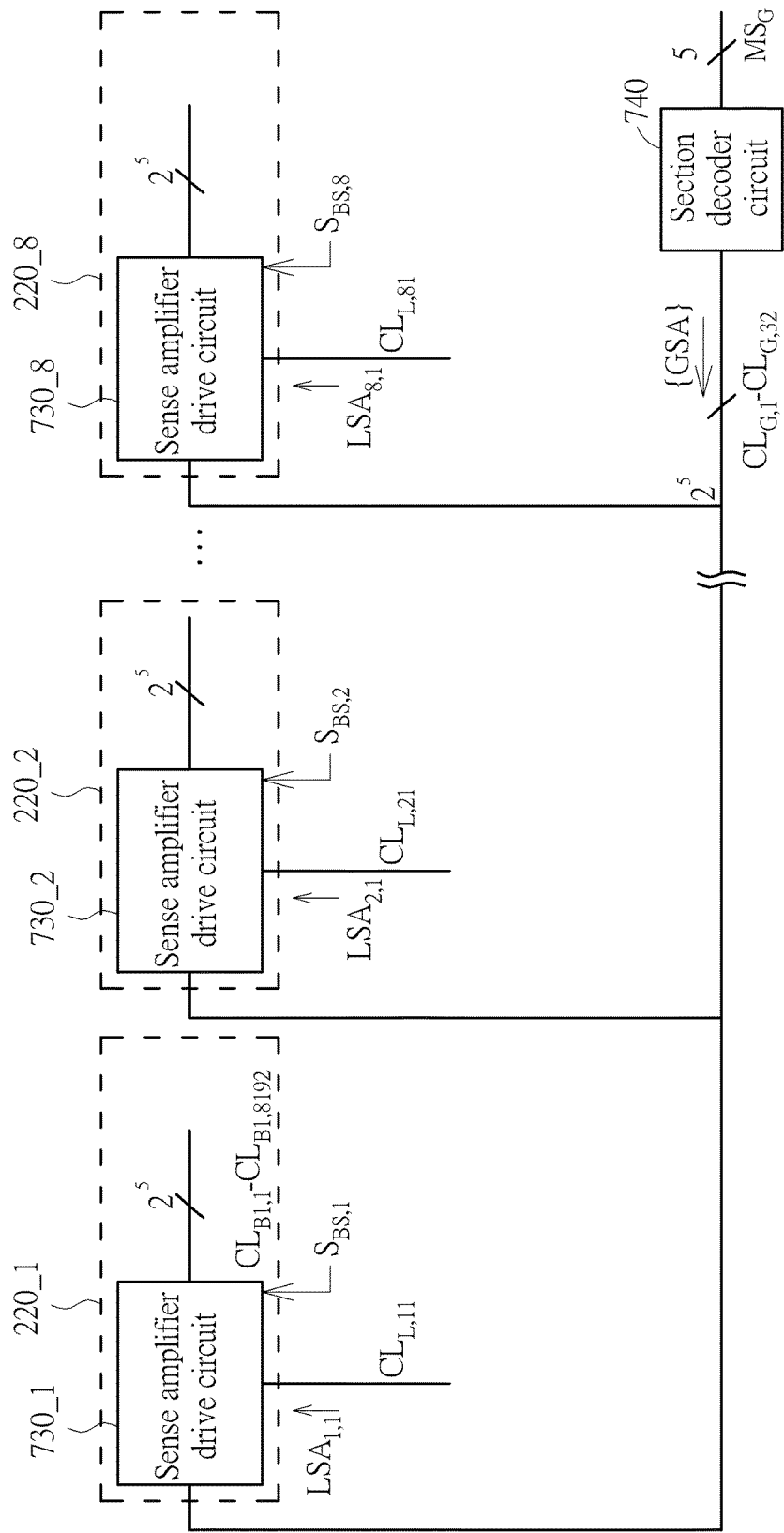
FIG. 7 is a diagram illustrating a control configuration employed in the memory architecture shown in FIG. 2 involved with sense amplification according to an embodiment of the present invention.

In addition to column selection, the proposed memory architecture may be used for other column operations such as sense amplification. Please refer to FIG. 2 and FIG. 7 together. FIG. 7 is a diagram illustrating a control configuration employed in the memory architecture 200 shown in FIG. 2 involved with sense amplification according to an embodiment of the present invention. In this embodiment, a portion or all of the global address $ADD_G$ shown in FIG. 2 may be implemented by a memory section address $MS_G$ shown in FIG. 7 (i.e. the global address $ADD_G$ may include the memory section address $MS_G$). A portion or all of a local drive circuit shown in FIG. 2 may be implemented by a sense amplifier drive circuit shown in FIG. 7 (i.e. the local drive circuit 230_1 may include a sense amplifier drive circuit 730_1, the local drive circuit 230_2 may include a sense amplifier drive circuit 730_2, and so on). A portion or all of the shared address decoder circuit 240 shown in FIG. 2 may be implemented by a section decoder circuit 740 shown in FIG. 7 (i.e. the shared address decoder circuit 240 may include the section decoder circuit 740).

In this embodiment, the memory architecture 200 may further include a plurality of first control lines $CL_{G,1}$-$CL_{G,32}$ and a plurality of second control lines $CL_{L,11}$-$CL_{L,81}$ (as shown in FIG. 7), wherein the K first control lines $CL_{G,1}$-$CL_{G,K}$ shown in FIG. 1 may be implemented by the first control lines $CL_{G,1}$-$CL_{G,32}$ (i.e. K=$2^5$), and a portion or all of each group of second control lines shown in FIG. 1 may be implemented by a single second control line (one of the second control lines $CL_{L,11}$-$CL_{L,81}$) (M=8). However, this is not meant to be a limitation of the present invention. It is possible to use a different number of first control lines, a different number of groups of second control lines, and/or a different number of second control lines within each group of second control lines.

The section decoder circuit 740 may be coupled to the memory banks 220_1-220_8 through the first control lines $CL_{G,1}$-$CL_{G,32}$, and arranged for decoding the memory section address $MS_G$ (ten bits in this implementation) to generate a set of section select signals {GSA}, wherein a plurality of section select signals $GSA_1$-$GSA_{32}$ included in the set of section select signals {GSA} may be transmitted to each of the sense amplifier drive circuits 730_1-730_8 through the first control lines $CL_{G,1}$-$CL_{G,32}$ according to the bank select signals $S_{BS,1}$-$S_{BS,8}$. In addition, each of the sense amplifier drive circuits 730_1-730_8 may receive a corresponding sense enable signal through one second control line of a corresponding group of second control lines. As a portion or all of each group of second control lines shown in FIG. 1 may be implemented by a single second control line (one of the second control lines $CL_{L,11}$-$CL_{L,81}$), the sense amplifier drive circuits 730_1-730_8 may receive a plurality of sense enable signals $LSA_{1,1}$-$LSA_{8,1}$ through the second control lines $CL_{L,11}$-$CL_{L,81}$ respectively, wherein the second control signals $S_{L,11}$-$S_{L,81}$ shown in FIG. 2 may be implemented by the sense enable signals $LSA_{1,1}$-$LSA_{8,1}$ shown in FIG. 7 respectively.

Each of the memory banks 220_1-220_8 may further include T third control lines (T=$2^5$ in this implementation), which may be disposed in correspondence with the columns of the memory bank respectively. Hence, the sense amplifier drive circuit of the memory bank may drive the columns through the T third control lines. For example, the sense amplifier drive circuit 730_1 of the memory bank 220_1 is coupled to the first control lines $CL_{G,1}$-$CL_{G,32}$, the second control line $CL_{L,11}$ and the third control lines $CL_{B1,1}$-$CL_{B1,32}$. Hence, the sense amplifier drive circuit 730_1 may drive/activate the third control lines $CL_{B1,1}$-$CL_{B1,32}$ according to the bank select signal $S_{BS,1}$, the received set of section select signals {GSA} and the sense enable signal $LSA_{1,1}$ in order to perform a sense amplification operation to sense and amplify data signal(s) stored in memory cell(s) through the third control lines $CL_{B1,1}$-$CL_{B1,32}$.

Figure 2:
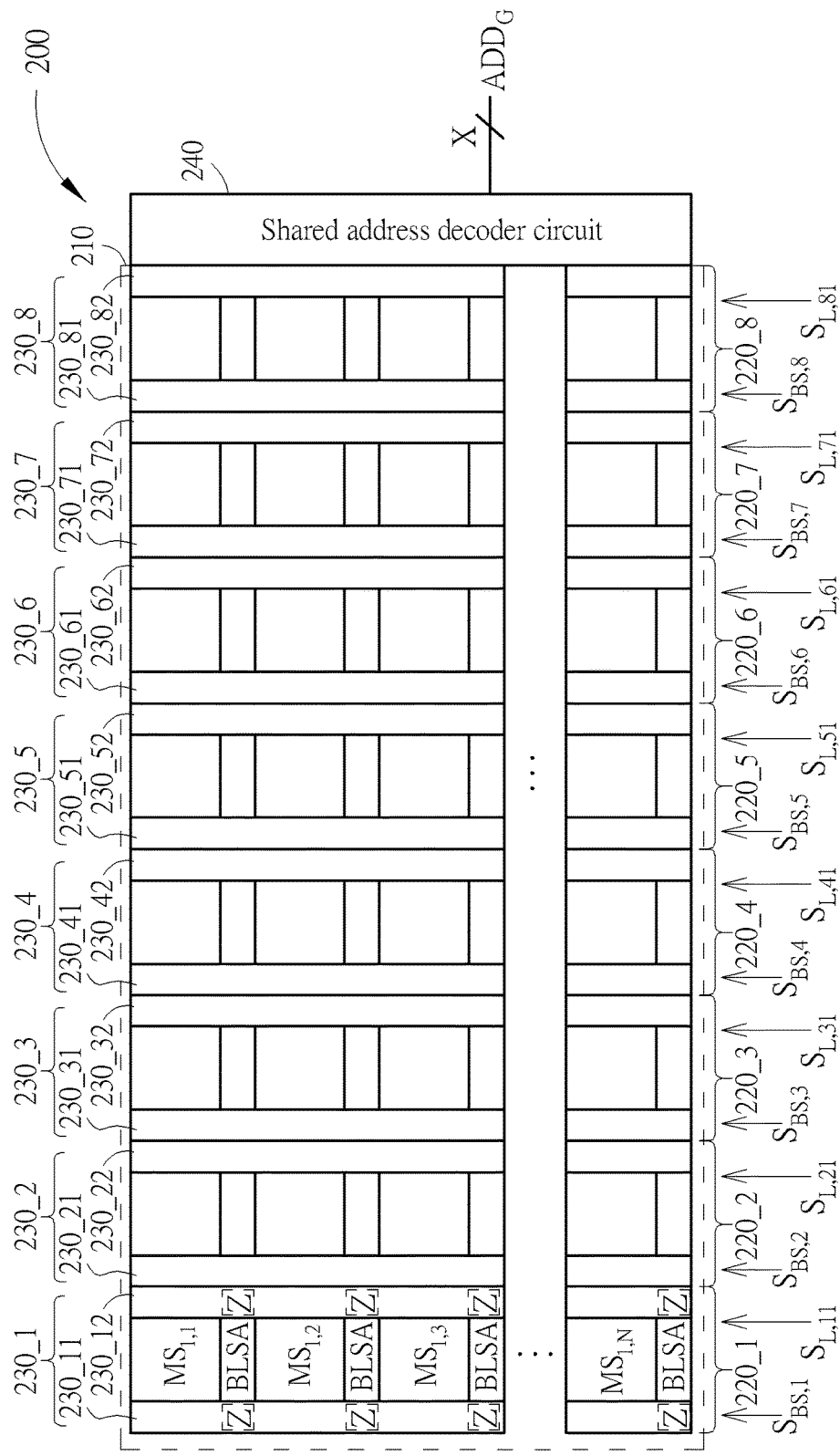
FIG. 2 is an implementation of the memory architecture shown in FIG. 1.

In some embodiments, each memory bank shown in FIG. 2 may have K sense amplifier circuits, wherein the K sense amplifier circuits may be disposed in correspondence with N memory sections of the memory bank. For example, regarding the memory bank 220_1 shown in FIG. 2, the K sense amplifier circuits (each being labeled BLSA) may be disposed in correspondence with N memory sections $MS_{1,1}$-$MS_{1,N}$. As one skilled in the art should understand that the K sense amplifier circuits BLSA may be disposed according to a bitline structure of the memory architecture 200 (e.g. an open bitline structure, a folded bitline structure, a folded bitline and shared sense amplifier structure and an interleaved bitline structure), further description of the correspondence between the sense amplifier circuits and the memory sections within each memory bank is omitted here for brevity.

Additionally, each of the K sense amplifier circuits is coupled to a corresponding third control line. In other words, the K sense amplifier circuits are coupled to a corresponding sense amplifier drive circuit through K third control lines of the T third control lines respectively. Hence, when a data signal stored in a memory cell within a memory bank is determined to be sensed and amplified, the memory bank may refer to a section select signal (indicating a sense amplifier circuit which corresponds to a memory section including the memory cell) and a sense enable signal to drive a corresponding third control line to access memory cell. Further description is provided below.

Figure 8:
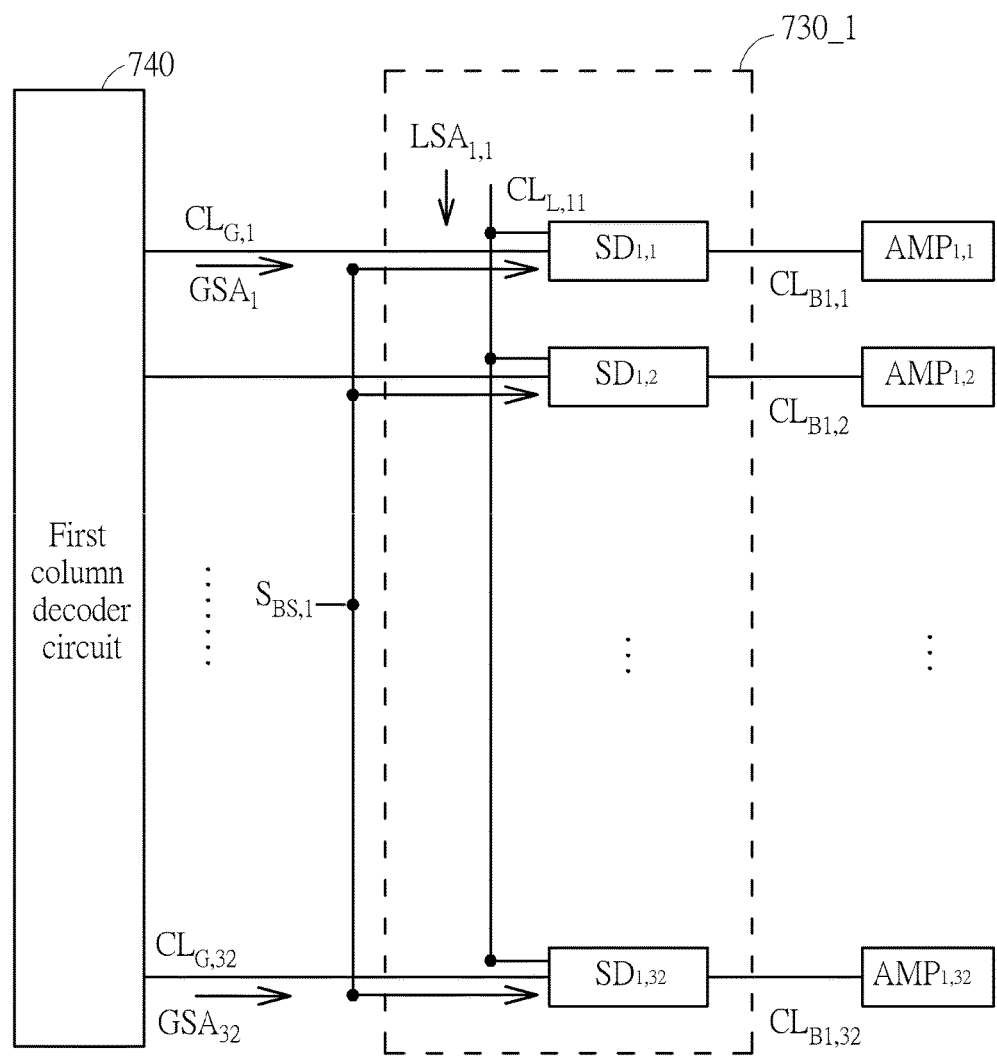
FIG. 8 is an implementation of the sense amplifier drive circuit shown in FIG. 7.

Please refer to FIG. 8 in conjunction with FIG. 2 and FIG. 7. FIG. 8 is an implementation of the sense amplifier drive circuit 730_1 shown in FIG. 7. The sense amplifier drive circuit 730_1 may include a plurality of sense amplifier drivers $SD_{1,1}$-$SD_{1,32}$, which are coupled to the first control lines $CL_{G1}$-$CL_{G,32}$ respectively. Each of the sense amplifier drivers $SD_{1,1}$-$SD_{1,32}$ is further coupled to the second control line $CL_{L,11}$ and a corresponding third control line (one of the third control lines $CL_{B1,1}$-$CL_{B1,32}$). Additionally, the set of section select signals {GSA} shown in FIG. 7 may include a plurality of section select signals $GSA_1$-$GSA_{32}$, which are transmitted to the sense amplifier drive circuit 730_1 (the sense amplifier drivers $SD_{1,1}$-$SD_{1,32}$) through the first control lines $CL_{G,1}$-$CL_{G,32}$ respectively. Hence, each of the sense amplifier drivers $SD_{1,1}$-$SD_{1,32}$ may receive a corresponding section select signal through one of the first control lines $CL_{G1}$-$CL_{G,32}$, and receive the enable signal $LSA_{1,1}$ through the second control line $CL_{L,11}$.

Furthermore, the memory bank 220_1 may include a plurality of sense amplifier circuits $AMP_{1,1}$-$AMP_{1,32}$, (e.g. BLSA shown in FIG. 2) which are disposed in correspondence with the memory sections $MS_{1,1}$-$MS_{1,N}$ (shown in FIG. 2) respectively. The sense amplifier drive circuit 730_1 may drive the sense amplifier circuits $AMP_{1,1}$-$AMP_{1,32}$ through the third control lines $CL_{B1,1}$-$CL_{B1,32}$ according to the bank select signal $S_{BS,1}$, the received set of section select signals {GSA} and the sense enable signal $LSA_{1,1}$ in order to perform a sense amplification operation to sense and amplify a data signal stored in a memory cell. For example, the sense amplifier driver $SD_{1,1}$ may drive the sense amplifier circuit $AMP_{1,1}$ through the third control line $CL_{B1,1}$.

In one implementation, each sense amplifier driver may be implemented by a latch-type driver. Please refer to FIG. 9, which is a diagram illustrating an implementation of the sense amplifier driver $SD_{1,1}$ shown in FIG. 8. In this implementation, the sense amplifier driver $SD_{1,1}$ may include an AND gate 962, an OR gate 964 and an AND gate 972. The AND gate 962 has an input terminal $N_{IS1}$, an input terminal $N_{IS2}$ and an output terminal $N_{OS1}$, wherein the input terminal $N_{IS1}$ is coupled to the first control line $CL_{G,1}$, and the input terminal $N_{IS2}$ is coupled to the bank select signal $S_{BS,1}$. The OR gate 964 has an input terminal $N_{IS3}$, an input terminal $N_{IS4}$ and an output terminal $N_{OS2}$, wherein the input terminal $N_{IS3}$ is coupled to the output terminal $N_{OS1}$, the input terminal $N_{IS4}$ is coupled to the third control line $CL_{B1,1}$, and the output terminal $N_{OS2}$ is arranged for outputting a third control signal $S_{SA1,1}$. The AND gate 972 has an input terminal $N_{IS5}$, an input terminal $N_{IS6}$ and an output terminal $N_{OS3}$, wherein the input terminal $N_{IS5}$ is coupled to the third control signal $S_{SA1,1}$, the input terminal $N_{IS6}$ is coupled to the second control line $CL_{L,11}$, and the output terminal $N_{OS3}$ is coupled to the third control line $CL_{B1,1}$.

Figure 9:
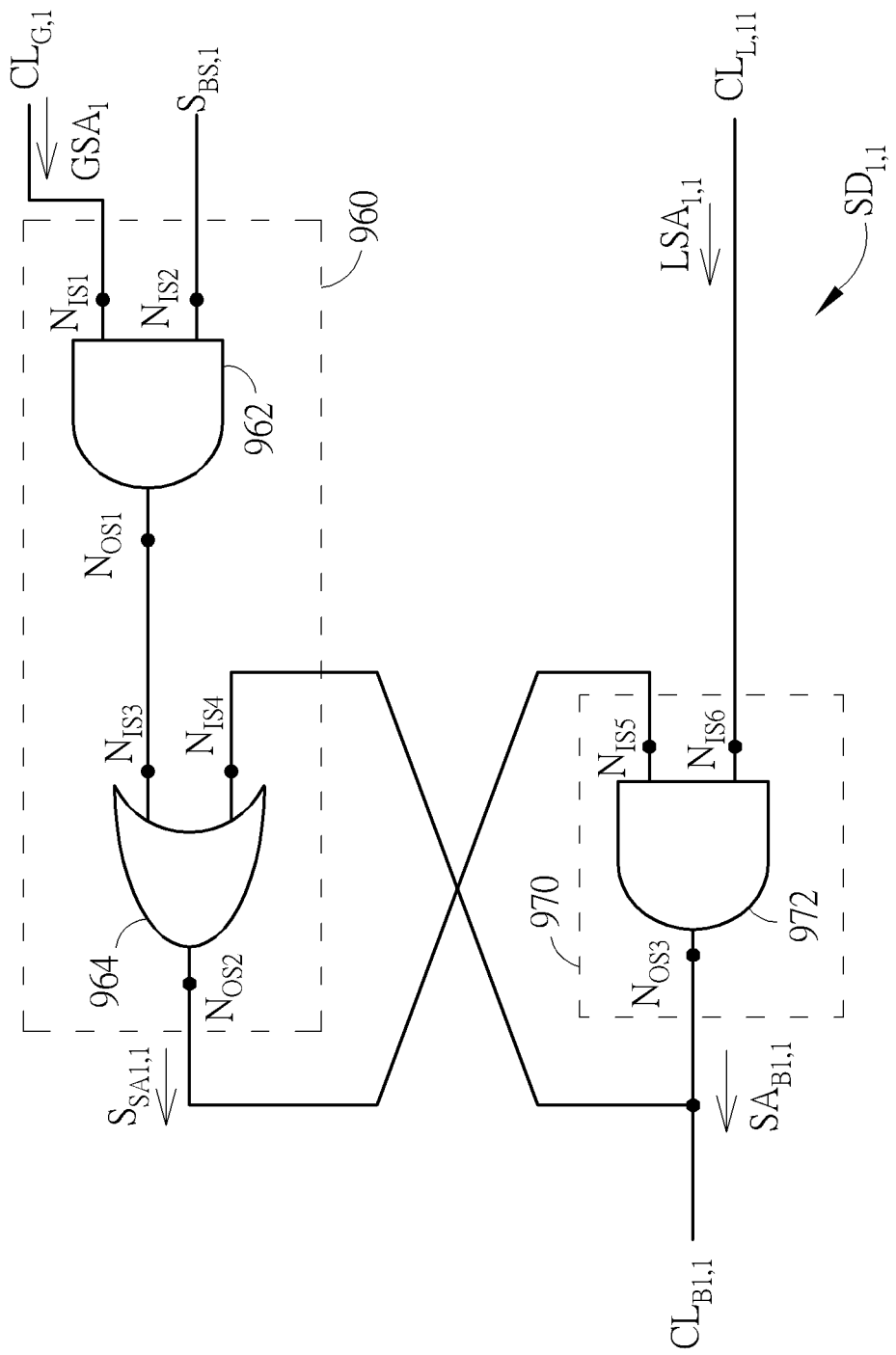
FIG. 9 is a diagram illustrating an implementation of the sense amplifier driver shown in FIG. 8.

Please refer to FIGS. 7-9 together. Consider a case where the sense amplifier drive circuit 730_1 is utilized to sense and amplify a data signal stored in a memory cell, wherein the sense amplifier circuit $AMP_{1,1}$ coupled to the third control line $CL_{B1,1}$ is expected to process the data signal stored in the memory cell. As the sense amplifier $AMP_{1,1}$ is disposed in correspondence with a memory section of the memory bank 220_1 (e.g. the memory section $MS_{1,1}$), the memory bank 220_1 is selected according to the memory bank select signal $S_{BS,1}$ (e.g. having a high signal level), the section select address $MS_G$ indicates activating the first control line $CL_{G,1}$ so that the sense amplifier circuit $AMP_{1,1}$ corresponding to the memory section is selected, and the sense enable signal $LSA_{1,1}$ is at a specific signal level (e.g. a high signal level) so that the sense amplifier $AMP_{1,1}$ is enabled. As the memory bank select signal $S_{BS,1}$ may have a high signal level, the section select signal $GSA_1$ (e.g. having a high signal level) may be transmitted to the input terminal $N_{IS5}$ through the AND gate 962 and the OR gate 964. In addition, since the sense enable signal $LSA_{1,1}$ may have a high signal level, the AND gate 972 may generate a drive signal $SA_{B1,1}$ having a high signal level to the third control line $CL_{B1,1}$. The sense amplifier driver $SD_{1,1}$ may accordingly sense and amplify the data signal stored in the memory cell to thereby drive the column corresponding to the memory cell.

It should be noted that, as the drive signal $SA_{B1,1}$ having the high signal level is fed to the input terminal $N_{IS4}$ of the OR gate 964, the third control signal $S_{SA1,1}$ can stay at a high signal level even if the bank select signal $S_{BS,1}$ or the section select signal $GSA_1$ goes low (e.g. another memory bank or a different sense amplifier is selected). Hence, the third control line $CL_{B1,1}$ may stay in an activation state rather than vary with a signal level of the section select signal $GSA_1$. In other words, the sense amplifier driver $SD_{1,1}$ may continue activating the third control line $CL_{B1,1}$ without being affected by the changed address information indicated by the memory section address $MS_G$.

Please note that the circuit topology of the sense amplifier driver shown in FIG. 9 is for illustrative purposes only, and is not meant to be a limitation of the present invention. For example, the sense amplifier driver $SD_{1,1}$ may be regarded as to include a control device 960 and a drive device 970, wherein the control device 960 may be implemented by the AND gate 962 and the OR gate 964, and the drive device 970 may be implemented by the AND gate 972. The drive device 970 may generate the drive signal $SA_{B1,1}$ to the third control line $CL_{B1,1}$ according to the third control signal $S_{SA1,1}$ and the sense enable signal $LSA_{1,1}$, and the control device 960 may generate the third control signal $S_{SA1,1}$ according to the bank select signal $S_{BS,1}$, the drive signal $SA_{B1,1}$ and the section select signal $GSA_1$.

Specifically, in a case where the third control line $CL_{B1,1}$ is deactivated in the beginning, when receiving the bank select signal $S_{BS,1}$ having a high signal level and the section select signal $GSA_1$ having a high signal level, the control device 960 may generate the third control signal $S_{SA1,1}$ having a high signal level to the drive device 970. Next, the drive device 970 may generate the drive signal $SA_{B1,1}$ having a high signal level according to the third control signal and the sense enable signal $LSA_{1,1}$, thereby activating the third control line $CL_{B1,1}$. When the third control line $CL_{B1,1}$ is in an activation state (e.g. after the third control line $CL_{B1,1}$ is activated; the drive signal $SA_{B1,1}$ has a high signal level), the control device 960 may generate the control signal $S_{SA1,1}$ according to the drive signal $SA_{B1,1}$ only (i.e. a signal level of the control signal $S_{SA1,1}$ may not be affected by the bank select signal $S_{BS,1}$ and the section select signal $GSA_1$), thereby maintain the activation state of the third control line $CL_{B1,1}$.

In an alternative design, the control device 960 may employ another circuit topology different the circuit topology shown in FIG. 9 based on the aforementioned operations. In another alternative design, the drive device 970 may employ another circuit topology different the circuit topology shown in FIG. 9 based on the aforementioned operations.

Please note that the above is for illustrative purposes only, and is not meant to be a limitation of the present invention. For example, the proposed memory architecture may include a plurality of memory cell arrays, wherein each memory cell array may employ the memory architecture shown in FIG. 1/FIG. 2. In another example, the number of column address bits, the number of memory banks, the number of memory sections and/or the number of control lines shown in FIG. 2 and FIG. 3 is not meant to be limitations of the present invention. In yet another example, the number of memory banks, the number of memory sections and/or the number of control lines shown in FIG. 7 is not meant to be limitations of the present invention. In still yet another example, different memory banks may have different numbers of second control lines.

Figure 10:
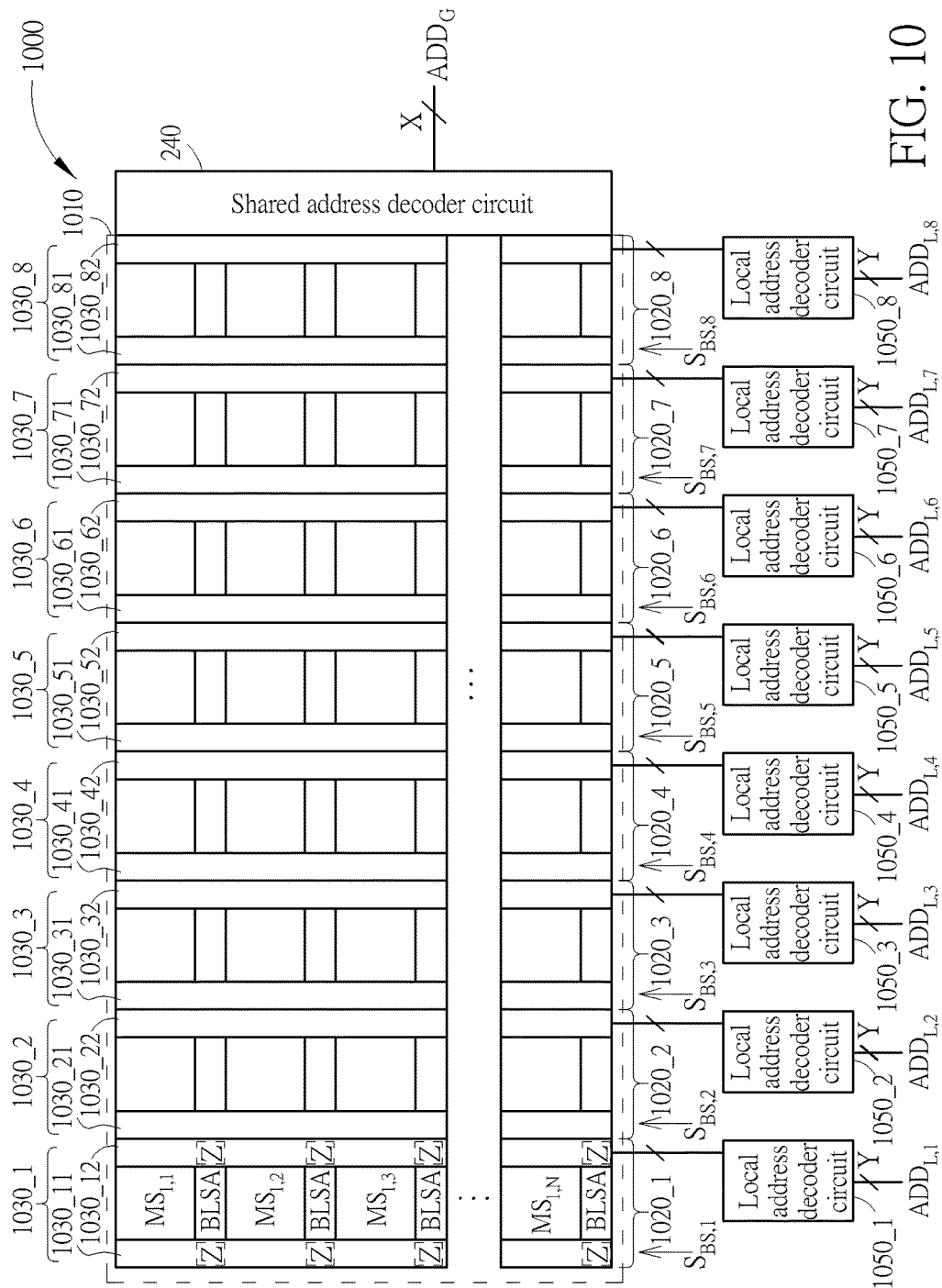
FIG. 10 illustrates an implementation of the memory architecture shown in FIG. 1.

FIG. 10 illustrates an implementation of the memory architecture 100 shown in FIG. 1. The architecture of the memory architecture 1000 shown in FIG. 10 is based on the architecture of the memory architecture 200 shown in FIG. 2, wherein the main difference is that each memory bank of the memory architecture 1000 may receive a plurality of second control signals through a plurality of second control lines. In other words, the memory architecture 1000 may be regarded as a memory architecture employing a hierarchical control scheme. In the embodiment shown in FIG. 10, the memory architecture 1000 may include the shared address decoder circuit 240 shown in FIG. 2, a memory cell array 1010 and a plurality of local address decoder circuits 1050_1-1050_8, wherein the memory cell array 210 may be implemented by the memory cell array 1010 including a plurality of memory banks 1020_1-1020_8. The local address decoder circuits 1050_1-1050_8 are coupled to the memory banks $1020\_1$-$1020\_8$ respectively, wherein each of the local address decoder circuits $1050\_1$-$1050\_8$ may decode a local address (one of Y-bit local addresses $ADD_{L,1}$-$ADD_{L,8}$, where Y is a positive integer) to generate a set of second control signals (e.g. one of the sets of second control signals $\{S_{L,1}\}$-$\{S_{L,M}\}$ shown in FIG. 1) to a corresponding memory bank.

Each of the memory banks $1020\_1$-$1020\_8$ may include a local drive circuit (i.e. one of local drive circuits $1030\_1$-$1030\_8$), wherein the local drive circuit may drive the columns according to a corresponding memory bank select signal (one of the bank select signals $S_{BS,1}$-$S_{BS,8}$), the set of first control signals generated by the shared address decoder circuit 240, and a set of second control signals generated by a corresponding local address decoder circuit so as to perform memory operations such as a column select operation. Additionally, the disposition of the local drive circuits $1030\_1$-$1030\_8$ may be similar to that of the local drive circuits $230\_1$-$230\_8$ shown in FIG. 2. For example, a portion of each local drive circuit (e.g. a local drive circuit $1030\_11$ of the local drive circuit $1030\_1$) may be disposed on one side of a corresponding memory bank in a column direction, and another portion of said each local drive circuit (e.g. a local drive circuit $1030\_12$ of the local drive circuit $1030\_1$) may be disposed on another side of the corresponding memory bank in the column direction.

Moreover, each of the local drive circuits $1030\_1$-$1030\_8$ may be implemented by a latch-type drive circuit. Accordingly, after the local drive circuit $1030\_1$ drives the memory bank $1020\_1$, another local drive circuit (one of the local drive circuits $1030\_2$-$1030\_8$) may drive a corresponding memory bank without waiting for the completion of data access operations of the memory bank $1020\_1$.

Figure 11:
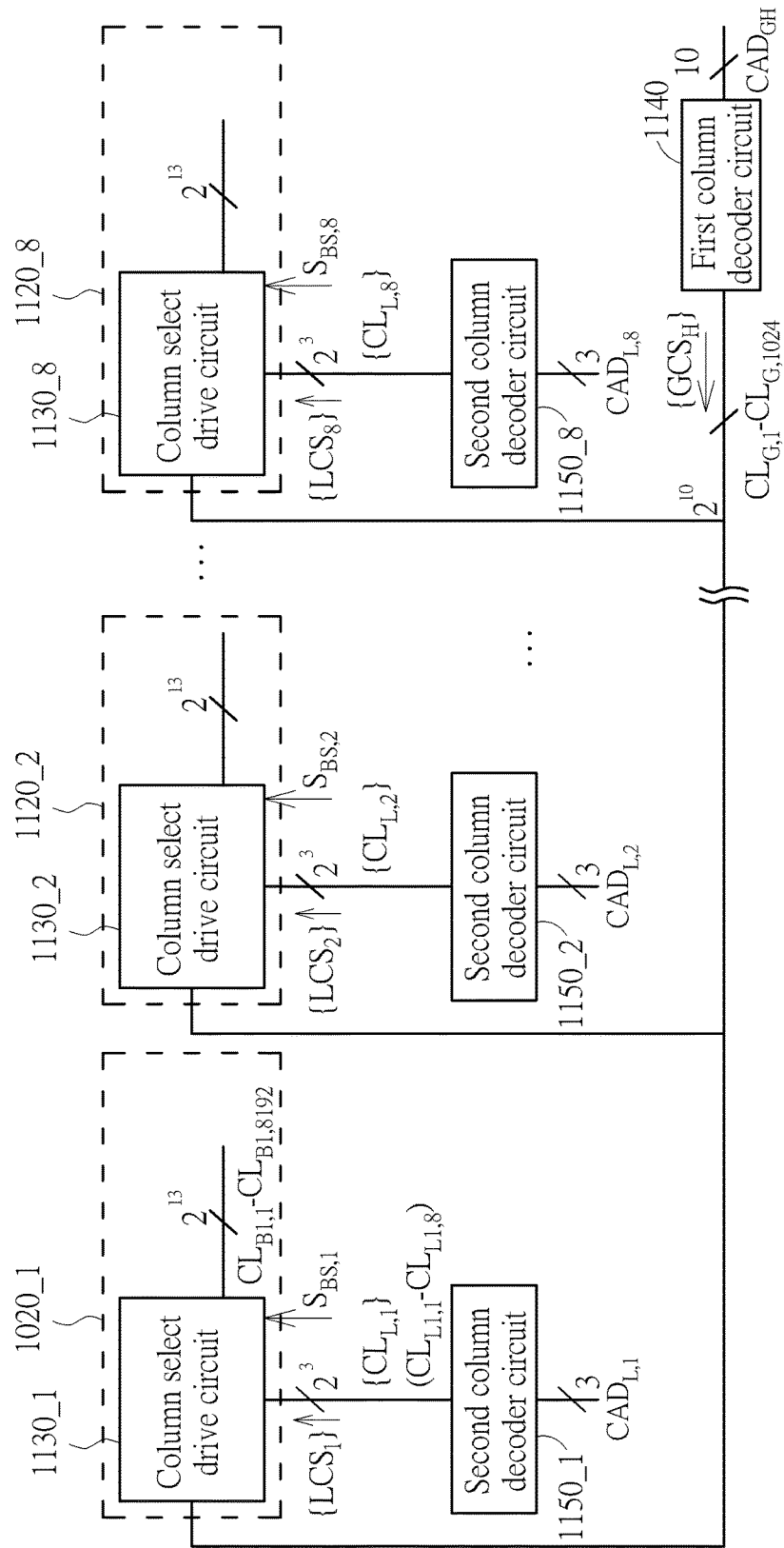
FIG. 11 is a diagram illustrating a hierarchical control configuration employed in the memory architecture shown in FIG. 10 involved with column selection according to an embodiment of the present invention.

In some embodiments, the proposed hierarchical control scheme may be used for column selection. Please refer to FIG. 10 and FIG. 11 together. FIG. 11 is a diagram illustrating a hierarchical control configuration employed in the memory architecture 1000 shown in FIG. 10 involved with column selection according to an embodiment of the present invention. In this embodiment, a portion or all of the global address $ADD_G$ shown in FIG. 2 may be implemented by a first column address $CAD_{GH}$ shown in FIG. 11 (i.e. the global address $ADD_G$ may include the first column address $CAD_{GH}$), and a portion or all of each local address shown in FIG. 10 may be implemented by a second column address shown in FIG. 11 (i.e. the local address $ADD_{L,1}$ may include a second column address $CAD_{L,1}$, the local address $ADD_{L,2}$ may include a second column address $CAD_{L,2}$, and so on).

In addition, a portion or all of a local drive circuit shown in FIG. 10 may be implemented by a column select drive circuit shown in FIG. 11 (i.e. the local drive circuit $1030\_1$ may include a column select drive circuit $1130\_1$, the local drive circuit $1030\_2$ may include a column select drive circuit $1130\_2$, and so on); a portion or all of the shared address decoder circuit 240 shown in FIG. 10 may be implemented by a first column decoder circuit 1140 shown in FIG. 11 (i.e. the shared address decoder circuit 240 may include the first column decoder circuit 1140); a portion or all of a local address decoder circuit shown in FIG. 10 may be implemented by a second column decoder circuit shown in FIG. 11 (i.e. the local address decoder circuit $1050\_1$ may include a second column decoder circuit $1150\_1$, the local address decoder circuit $1050\_2$ may include a second column decoder circuit $1150\_2$, and so on).

The memory architecture 1000 may further include a plurality of first control lines $CL_{G,1}$-$CL_{G,1024}$ and a plurality of groups of second control lines $\{CL_{L,1}\}$-$\{CL_{L,8}\}$ (as shown in FIG. 11), wherein each group of second control lines may have L second control lines ($L=2^3$ in this implementation). Please note that the memory cell array 110, the K first control lines $CL_{G,1}$-$CL_{G,K}$ and the M groups of second control lines $\{CL_{L,1}\}$-$\{CL_{L,M}\}$ shown in FIG. 1 may be implemented by the memory cell array 1010, the first control lines $CL_{G,1}$-$CL_{G,1024}$ and the groups of second control lines $\{CL_{L,1}\}$-$\{CL_{L,8}\}$ (i.e. $K=2^{10}$ and $M=8$). Furthermore, the control configuration shown in FIG. 3 may be regarded as one of specific cases where each group of second control lines shown in FIG. 11 have one second control line ($L=1$).

The first column decoder circuit 1140 may be coupled to the memory banks $1020\_1$-$1020\_8$ through the first control lines $CL_{G,1}$-$CL_{G,1024}$, and arranged for decoding the first column address $CAD_{GH}$ (ten bits in this implementation) to generate a set of first column select signals $\{GCS_H\}$, wherein a plurality of first column select signals $GCS_{H,1}$-$GCS_{H,1024}$ included in the set of first column select signals $\{GCS_H\}$ may be transmitted to each of the column select drive circuits $1130\_1$-$1130\_8$ through the first control lines $CL_{G,1}$-$CL_{G,1024}$ according to the bank select signals $S_{BS,1}$-$S_{BS,8}$. The second column decoder circuit $1150\_1$-$1150\_8$ may be coupled to the memory banks $1020\_1$-$1020\_8$ through the groups of second control lines $\{CL_{L,1}\}$-$\{CL_{L,8}\}$ respectively, wherein each second column decoder circuit may be arranged for decoding a corresponding second column address (three bits in this implementation) to generate a corresponding set of second column select signals (one of a plurality of sets of second column select signals $\{LCS_1\}$-$\{LCS_8\}$). The generated set of second column select signals may be transmitted to a corresponding memory bank (or a column select drive circuit) through a corresponding group of second control lines.

Each of the memory banks $1020\_1$-$1020\_8$ may further include T third control lines ($T=2^{13}$ in this implementation), which may be disposed in correspondence with the columns of the memory bank respectively. Hence, the column select drive circuit of the memory bank may drive/select the columns through the T third control lines. For example, the column select drive circuit $1130\_1$ of the memory bank $1020\_1$ is coupled to the first control lines $CL_{G,1}$-$CL_{G,1024}$, a plurality of second control lines $CL_{L1,1}$-$CL_{L1,8}$ and a plurality of third control lines $CL_{B1,1}$-$CL_{B1,8192}$. Hence, the column select drive circuit $1130\_1$ may drive/activate the third control lines $CL_{B1,1}$-$CL_{B1,8192}$ according to the bank select signal $S_{BS,1}$, the received set of first column select signals $\{GCS_H\}$ and the set of second column select signals $\{LCS_1\}$ in order to perform a column select operation to select at least one bit line within the memory bank $1020\_1$ through the third control lines $CL_{B1,1}$-$CL_{B1,8192}$.

Figure 12:
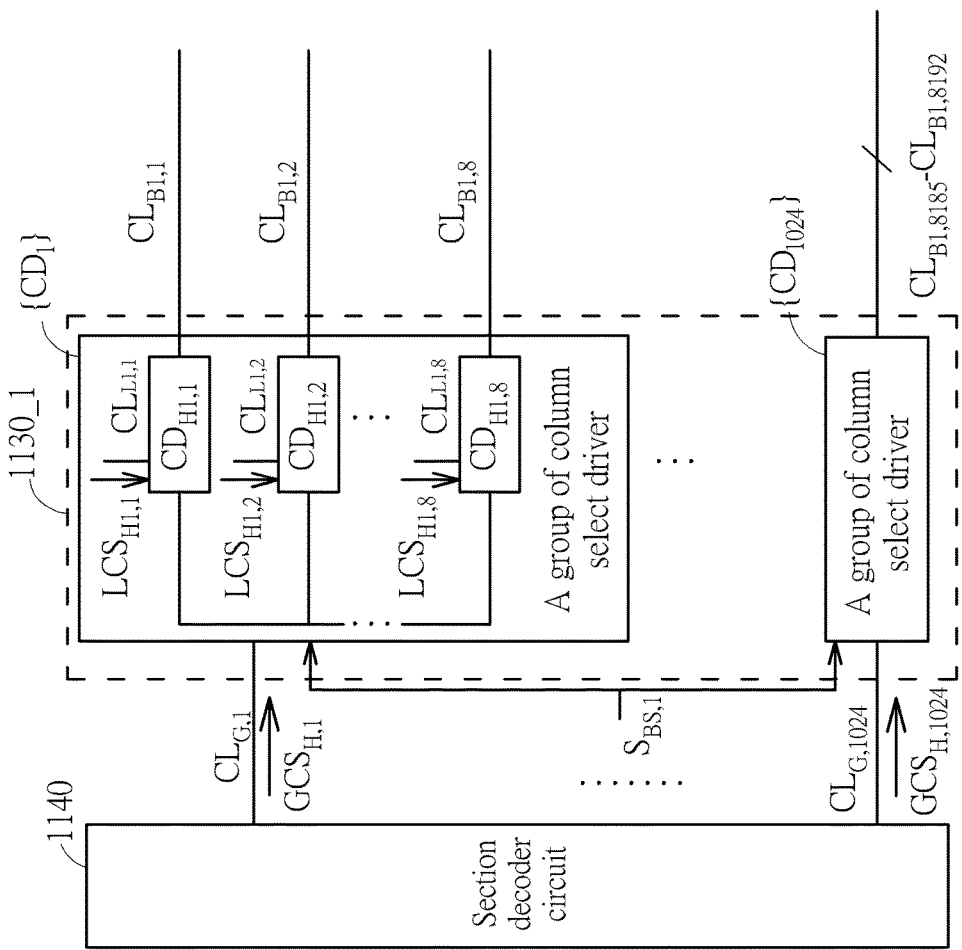
FIG. 12 illustrates an implementation of the column select drive circuit shown in FIG. 11.

FIG. 12 illustrates an implementation of the column select drive circuit $1130\_1$ shown in FIG. 11. The column select drive circuit $1130\_1$ may include a plurality of groups of column select drivers $\{CD_1\}$-$\{CD_{1024}\}$, which are coupled to the first control lines $CL_{G,1}$-$CL_{G,1024}$ respectively. Each group of column select drivers $\{CD_1\}$-$\{CD_{1024}\}$ may include a plurality of column select drivers, and each of the column select drivers are coupled to a first control line coupled to the group of column select drivers. Additionally, the column select drivers are coupled to the second control lines $CL_{L1,1}$-$CL_{L1,8}$ (which are coupled to the column select drive circuit $1130\_1$) respectively, and are coupled to corresponding third control lines (within the third control lines $CL_{B1,1}$-$CL_{B1,8192}$) respectively. For example, the group of column select drivers $\{CD_1\}$ may include a plurality of column select drivers $CD_{H1,1}$-$CD_{H1,8}$, wherein each of the column select drivers $CD_{H1,1}$-$CD_{H1,8}$ is coupled to a first control line $CL_{G,1}$, and the column select drivers $CD_{H1,1}$-$CD_{H1,8}$ are coupled to the second control lines $CL_{L1,1}$-$CL_{L1,8}$ respectively. The column select drivers $CD_{H1,1}$-$CD_{H1,8}$ are further coupled to a plurality of third control lines $CL_{B1,1}$-$CL_{B1,8}$ respectively so as to drive the respective columns.

By way of example but not limitation, each group of column select drivers may have the same number of column select drivers in this implementation. Hence, respective third control lines coupled to the groups of column select drivers may have the same number of control lines. For example, the group of column select drivers $\{CD_{1024}\}$ may be coupled to the third control lines $CL_{B1,8185}$-$CL_{B1,8192}$. Additionally, the set of first column select signals $\{GCS_H\}$ shown in FIG. 11 may include a plurality of first column select signals $GCS_{H,1}$-$GCS_{H,1024}$ respectively transmitted through the first control lines $CL_{G,1}$-$CL_{G,1024}$, and the set of second column select signals $\{LCS_1\}$ shown in FIG. 11 may include a plurality of second column select signals $LCS_{H1,1}$-$LCS_{H1,8}$ respectively transmitted through the second control lines $CL_{L1,1}$-$CL_{L1,8}$.

In one implementation, each column select driver within the groups of column select drivers $\{CD_1\}$-$\{CD_{1024}\}$ may be implemented by a latch-type driver. Byway of example but not limitation, each column select driver within the groups of column select drivers $\{CD_1\}$-$\{CD_{1024}\}$ may be implemented by the column select driver $CD_{1,1}$ shown in FIG. 5. As one skilled in the art, after reading the above paragraphs directed to FIGS. 4-6, should understand the circuit structure and operation of each column select driver shown in FIG. 12 which is implemented by a latch-type driver such as the column select driver $CD_{1,1}$ shown in FIG. 5, similar description is not repeated here for brevity.

Figure 13:
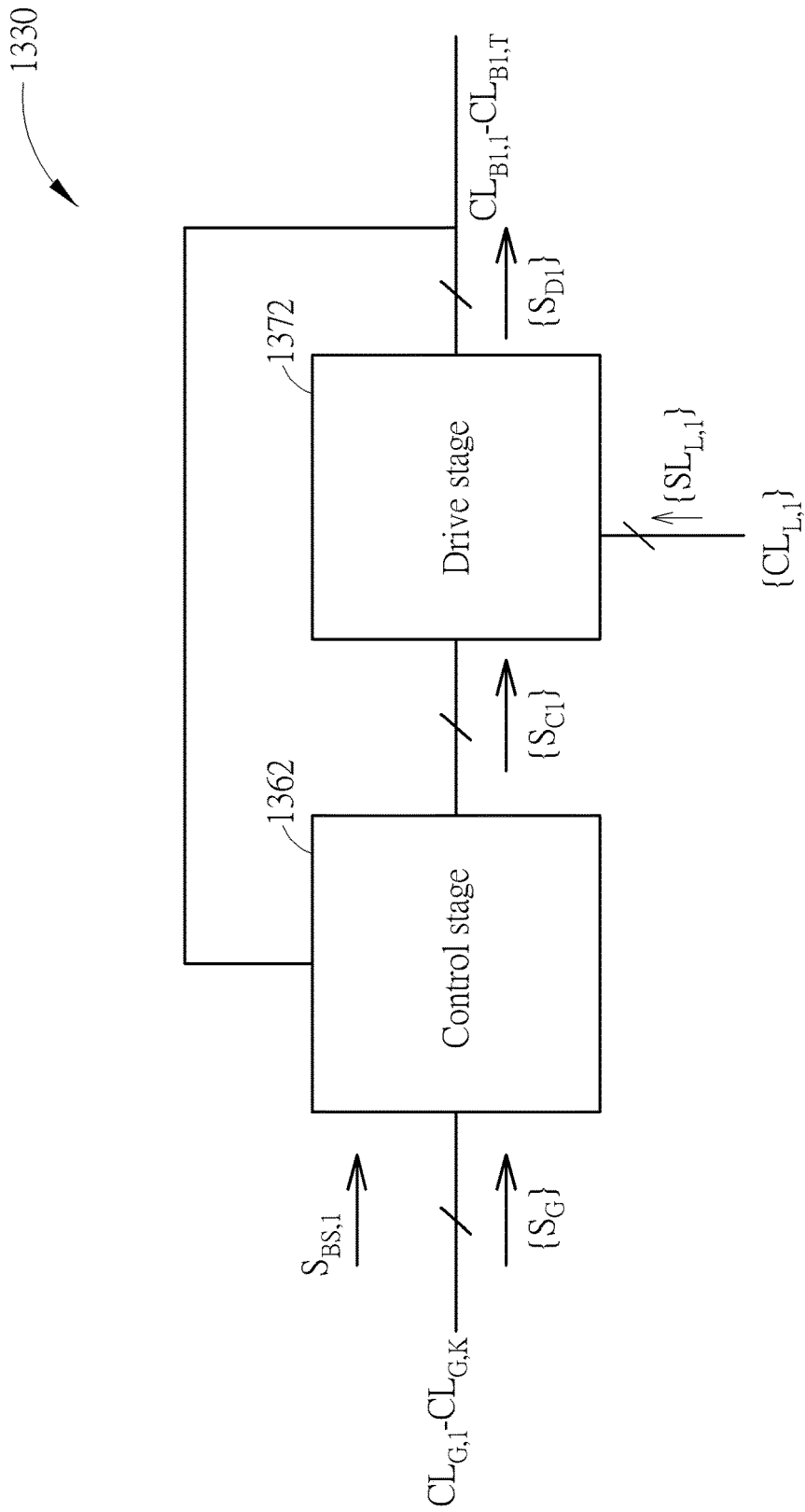
FIG. 13 is an implementation of the local drive circuit shown in FIG. 2 and/or the local drive circuit shown in FIG. 10.

Please note that, in an alternative design, the architecture of the control device and the drive device shown in FIG. 5/FIG. 9 may be employed in a local drive circuit. Please refer to FIG. 13, which is an implementation of the local drive circuit 230_1 shown in FIG. 2 and/or the local drive circuit 1030_1 shown in FIG. 10. In this implementation, the local drive circuit 1330 may include a control stage 1362 and a drive stage 1372. The drive stage 1372 is coupled to the T third control lines $CL_{B1,1}$-$CL_{B1,T}$ and the group of second control lines $\{CL_{L1}\}$ coupled to the local drive circuit 1330 (i.e. the second control line $CL_{L,11}$ shown in FIG. 3/FIG. 7 and/or the second control lines $CL_{L1,1}$-$CL_{L1,8}$ shown in FIG. 11). The drive stage 1372 may be arranged for generating a set of drive signals $\{S_{D1}\}$ according to a set of third control signals $\{S_{C1}\}$ and the set of second control signals $\{S_{L1}\}$, and accordingly driving the third control lines $CL_{B1,1}$-$CL_{B1,T}$. The control stage 1362 is coupled to the K first control lines $CL_{G,1}$-$CL_{G,K}$, the drive stage 1372, the third control lines $CL_{B1,1}$-$CL_{B1,T}$ and the bank select signal $S_{BS,1}$. The control stage 1362 may be arranged for generating the set of control signals $\{S_{C1}\}$ according to the set of drive signals $\{S_{D1}\}$ and the set of first control signals $\{S_G\}$ and the bank select signal $S_{BS,1}$.

By way of example but not limitation, in a case where the local drive circuit 1330 is used as a column select drive circuit, when each column select driver within the column select drive circuit 330_1 shown in FIG. 4 (or the column select drive circuit 1130_1 shown in FIG. 12) is implemented by the control device 560 and the drive device 570 shown in FIG. 5, the control stage 1362 may be implemented by control devices within the column select drivers $CD_{1,1}$-$CD_{1,8192}$ shown in FIG. 4 (or the sets of column select drivers $\{CD_1\}$-$\{CD_{1024}\}$ shown in FIG. 12), and the drive stage 1372 may be implemented by drive devices within the column select drivers $CD_{1,1}$-$CD_{1,8192}$ shown in FIG. 4 (or the sets of column select drivers $\{CD_1\}$-$\{CD_{1024}\}$ shown in FIG. 12). As a person skilled in the art should understand operations of the local drive circuit 1330 used for column selection after reading the above paragraphs directed to FIG. 4, FIG. 5 and FIG. 12, further description is omitted here for brevity.

In another example, consider a case where the local drive circuit 1330 is used as a sense amplifier drive circuit. When each sense amplifier driver within the sense amplifier drive circuit 730_1 shown in FIG. 8 is implemented by the control device 960 and the drive device 970 shown in FIG. 9, the control stage 1362 may be implemented by control devices within the sense amplifier drivers $SD_{1,1}$-$SD_{1,32}$ shown in FIG. 8, and the drive stage 1372 may be implemented by drive devices within the sense amplifier drivers $SD_{1,1}$-$SD_{1,32}$ shown in FIG. 8. As a person skilled in the art should understand operations of the local drive circuit 1330 used for sense amplification after reading the above paragraphs directed to FIG. 8 and FIG. 9, further description is omitted here for brevity.

To sum up, the proposed memory architecture may provide a plurality of memory banks (a single memory cell array can include a plurality of memory banks) and utilize a latch-type local drive circuit to realize seamless column select operations and/or sense amplification operations, thereby achieving the objectives of high bandwidth data access and high speed random access.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory architecture, comprising:
K first control lines, wherein K is a positive integer;
M groups of second control lines, wherein M is a positive integer, and each of the M groups of second control lines comprises at least one second control line; and
a memory cell array, comprising:
M memory banks, wherein each of the M memory banks comprises a plurality of memory cells arranged in rows and columns; each of the M memory banks is coupled to the K first control lines, while the M memory banks are coupled to the M groups of second control lines respectively; the M memory banks are selected according to M bank select signals respectively so as to receive a shared set of first control signals through the K first control lines; the M memory banks receive independent M sets of second control signals through the M groups of second control lines respectively; and each of the M memory banks drives the columns according to a corresponding bank select signal, the shared set of first control signals and a corresponding set of second control signals within the independent M sets of second control signals so as to perform one of a column select operation and a sense amplification operation; wherein each of the M memory banks further comprises:
a plurality of third control lines, disposed in correspondence with the columns of the memory bank respectively; and
a local drive circuit, coupled to the K first control lines, a group of second control lines corresponding to the memory bank and the third control lines, the local drive circuit arranged for driving the third control lines according to a bank select signal corresponding to the memory bank, the shared set of first control signals and a corresponding set of second control signals within the independent M sets of second control signals in order to perform said one of the column select operation and the sense amplification operation.

2. The memory architecture of claim 1, wherein the local drive circuit is a latch-type drive circuit.

3. The memory architecture of claim 1, wherein the local drive circuit comprises a column select drive circuit; the shared set of first control signals received by the M memory banks is a set of first column select signals, and the independent M sets of second control signals received by the M memory banks are M sets of second column select signals; and the column select drive circuit drives the third control lines according to the bank select signal corresponding to the memory bank, the received set of first column select signals and a set of second column select signals corresponding to the memory bank in order to perform the column select operation to select at least one bit line.

4. The memory architecture of claim 3, wherein the group of second control lines coupled to the column select drive circuit comprises L second control lines, L is a positive integer, and the column select drive circuit comprises:
K groups of column select drivers, coupled to the K first control lines respectively, wherein one of the K groups of column select drivers comprises:
L column select drivers, wherein each of the L column select drivers is coupled to a first control line coupled to the set of column select drivers; and the L column select drives are coupled to the L second control lines respectively, and are coupled to L of the third control lines respectively.

5. The memory architecture of claim 4, wherein the set of first column select signals received by the column select drive circuit comprises K first column select signals transmitted respectively through the K first control lines; the set of second column select signals received by the column select drive circuit comprises L second column select signals transmitted respectively through the L second control lines; and each of the L column select drivers comprises:
a drive device, coupled to a second control line coupled to the column select driver and coupled to a third control line coupled to the column select driver, the drive device arranged for generating a drive signal to the third control line coupled to the column select driver according to a third control signal and a second column select signal received by the column select driver; and
a control device, coupled to the drive device, a first control line coupled to the column select driver, and the third control line coupled to the column select driver, the control device arranged for generating the third control signal according to the bank select signal received by the column select drive circuit, the drive signal and a first column select signal received by the column select driver.

6. The memory architecture of claim 5, wherein the drive device comprises:
an AND gate, having a first input terminal, a second input terminal and an output terminal, wherein the first input terminal is coupled to the third control signal, the second input terminal is coupled to the second control line coupled to the column select driver, and the output terminal is coupled to the third control line coupled to the column select driver.

7. The memory architecture of claim 5, wherein the control device comprises:
an AND gate, having a first input terminal, a second input terminal and a first output terminal, wherein the first input terminal is coupled to the first control line coupled to the column select driver, and the second input terminal is coupled to the bank select signal; and
an OR gate, having a third input terminal, a fourth input terminal and a second output terminal, wherein the third input terminal is coupled to the first output terminal, the fourth input terminal is coupled to the third control line coupled to the column select driver, and the second output terminal is arranged for outputting the third control signal to the drive device.

8. The memory architecture of claim 1, wherein the local drive circuit comprises a sense amplifier drive circuit; each of the M memory banks is divided into N memory sections, and N is a positive integer; and each of the M memory banks further comprises:
K sense amplifier circuits, disposed in correspondence with the N memory sections of the memory bank, wherein the K sense amplifier circuits are coupled to the sense amplifier drive circuit through K third control lines of the third control lines respectively;
wherein the shared set of first control signals received by the M memory banks is a set of section select signals; the independent M sets of second control signals are M sense enable signals respectively, and the sense amplifier drive circuit receives a corresponding sense enable signal through one second control line of the group of second control lines; and the sense amplifier drive circuit drives the K sense amplifier circuits through the K third control lines according to the bank select signal corresponding to the memory bank, the received set of section select signals and the corresponding sense enable signal in order to perform the sense amplification operation to sense and amplify a data signal stored in a memory cell.

9. The memory architecture of claim 8, wherein the sense amplifier drive circuit comprises:
K sense amplifier drivers, coupled to the K first control lines respectively, wherein the K sense amplifier drivers are further coupled to the K third control lines respectively, and each of the K sense amplifier drivers is coupled to said one second control line of the group of second control lines.

10. The memory architecture of claim 9, wherein the set of section select signals received by the sense amplifier drive circuit comprises K section select signals transmitted respectively through the K first control lines; each of the K sense amplifier drivers receives the corresponding enable signal through said one second control line of the group of second control lines; and each of the K sense amplifier drivers comprises:
a drive device, coupled to said one second control line coupled to the sense amplifier driver and coupled to a third control line coupled to the sense amplifier driver, the drive device arranged for generating a drive signal to the third control line coupled to the sense amplifier driver according to a third control signal and the corresponding sense enable signal received by the sense amplifier driver; and
a control device, coupled to the drive device, a first control line coupled to the sense amplifier driver, and the third control line coupled to the sense amplifier driver, the control device arranged for generating the third control signal according to the bank select signal received by the sense amplifier drive circuit, the drive signal and a section select signal received by the sense amplifier driver.

11. The memory architecture of claim 10, wherein the drive device comprises:
an AND gate, having a first input terminal, a second input terminal and an output terminal, wherein the first input terminal is coupled to the third control signal, the second input terminal is coupled to said one second control line coupled to the sense amplifier driver, and the output terminal is coupled to the third control line coupled to the sense amplifier driver.

12. The memory architecture of claim 10, wherein the control device comprises:
an AND gate, having a first input terminal, a second input terminal and a first output terminal, wherein the first input terminal is coupled to the first control line coupled to the sense amplifier driver, and the second input terminal is coupled to the bank select signal; and
an OR gate, having a third input terminal, a fourth input terminal and a second output terminal, wherein the third input terminal is coupled to the first output terminal, the fourth input terminal is coupled to the third control line coupled to the sense amplifier driver, and the second output terminal is arranged for outputting the third control signal to the drive device.

13. The memory architecture of claim 1, wherein the local drive circuit comprises:
a drive stage, coupled to the third control lines and the group of second control lines coupled to the local drive circuit, the drive stage arranged for generating a set of drive signals according to a set of third control signals and the corresponding set of second control signals received by the local circuit, and accordingly driving the third control lines; and
a control stage, coupled to the drive stage, the K first control lines, the third control lines and the bank select signal received by the local drive circuit, wherein the control stage is arranged for generating the set of third control signals according to the set of drive signals, the shared set of first control signals and the bank select signal received by the local drive circuit.

14. The memory architecture of claim 1, wherein the shared set of first control signals received by the M memory banks is a set of first column select signals, and the independent M sets of second control signals received by the M memory banks are M sets of second column select signals; and each of the M memory banks performs the column select operation according to a corresponding bank select signal, the set of first column select signals and a corresponding set of second column select signals so as to select at least one bit line.

15. The memory architecture of claim 14, further comprising:

a first column decoder circuit, coupled to the M memory banks through the K first control lines, the first column decoder circuit arranged for decoding a first column address to generate the set of first column select signals.

16. The memory architecture of claim 15, wherein each of the M sets of second column select signals comprises a plurality of second column select signals, and the memory architecture further comprises:
M second column decoder circuits, coupled to the M memory banks through the M groups of second control lines respectively, wherein each of the M second column decoder circuits is arranged for decoding a second column address to generate a set of second column select signals received by a corresponding memory bank coupled to the second column decoder circuit.

17. A memory architecture, comprising:
K first control lines, wherein K is a positive integer;
M groups of second control lines, wherein M is a positive integer, and each of the M groups of second control lines comprises at least one second control line; and
a memory cell array, comprising:
M memory banks, wherein each of the M memory banks comprises a plurality of memory cells arranged in rows and columns; each of the M memory banks is coupled to the K first control lines, while the M memory banks are coupled to the M groups of second control lines respectively; the M memory banks are selected according to M bank select signals respectively so as to receive a shared set of first control signals through the K first control lines; the M memory banks receive independent M sets of second control signals through the M groups of second control lines respectively; and each of the M memory banks drives the columns according to a corresponding bank select signal, the shared set of first control signals and a corresponding set of second control signals within the independent M sets of second control signals so as to perform one of a column select operation and a sense amplification operation; wherein each of the M memory banks is divided into N memory sections, and N is a positive integer; the shared set of first control signals received by the M memory banks is a set of section select signals, and the independent M sets of second control signals received by the M memory banks are M sense enable signals respectively; and each of the M memory banks performs the sense amplification operation according to a corresponding section select signal, the set of first column select signals and a corresponding sense enable signal so as to sense and amplify a data signal stored in a memory cell.

18. The memory architecture of claim 17, further comprising:
a section decoder circuit, coupled to the M memory banks through the K first control lines, the section decoder circuit arranged for decoding a memory section address to generate the set of section select signals.

* * * * *